United States Patent
Le Perchec

(10) Patent No.: US 11,316,062 B2
(45) Date of Patent: Apr. 26, 2022

(54) ELECTROMAGNETIC RADIATION DETECTOR STRUCTURE HAVING HIGHLY EFFICIENT ABSORPTION AND METHOD FOR MANUFACTURING SAID STRUCTURE

(71) Applicant: COMMISSARIAT À L'ÉNERGIE ATOMIQUE ET AUX ÉNERGIES ALTERNATIVES, Paris (FR)

(72) Inventor: Jérôme Le Perchec, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 268 days.

(21) Appl. No.: 16/801,669

(22) Filed: Feb. 26, 2020

(65) Prior Publication Data

US 2020/0274018 A1 Aug. 27, 2020

(30) Foreign Application Priority Data

Feb. 27, 2019 (FR) ..................... 1902036

(51) Int. Cl.
*H01L 31/101* (2006.01)
*H01L 31/0232* (2014.01)
*H01L 31/18* (2006.01)

(52) U.S. Cl.
CPC ...... *H01L 31/101* (2013.01); *H01L 31/02327* (2013.01); *H01L 31/18* (2013.01)

(58) Field of Classification Search
CPC . H01L 31/103; H01L 31/18; H01L 31/02327; H01L 31/101
See application file for complete search history.

(56) References Cited

U.S. PATENT DOCUMENTS

| 8,125,043 B2 | 2/2012 | Boutami |
| 10,128,386 B2 | 11/2018 | Boulard et al. |
| 2006/0151807 A1 | 7/2006 | Pardo et al. |
| 2018/0212080 A1 | 7/2018 | Meyer et al. |

FOREIGN PATENT DOCUMENTS

| FR | 2842945 A1 | 1/2004 |
| FR | 2992471 A1 | 12/2013 |

OTHER PUBLICATIONS

Preliminary French Search Report for French application No. FR1902036 dated Dec. 17, 2019.

*Primary Examiner* — Mark R Gaworecki
(74) *Attorney, Agent, or Firm* — Pearne & Gordon LLP

(57) ABSTRACT

An electromagnetic radiation detector structure is adapted to detect electromagnetic radiation in at least one first given range of wavelengths centred around a first wavelength $\lambda_0$. The detector structure comprises an absorption region of sub-wavelength thickness configured to absorb electromagnetic radiation, the absorption region having a refractive index $n_a$, and a Fabry-Perot cavity housing the absorption region. The disclosure further concerns a method to manufacture the detector structure.

14 Claims, 23 Drawing Sheets

ELECTROMAGNETIC RADIATION DETECTOR STRUCTURE HAVING HIGHLY EFFICIENT ABSORPTION AND METHOD FOR MANUFACTURING SAID STRUCTURE

CROSS-REFERENCE TO RELATED APPLICATIONS

This application claims priority from French Patent Application No. 1902036 filed on Feb. 27, 2019. The content of this application is incorporated herein by reference in its entirety.

TECHNICAL FIELD

The invention concerns the field of optoelectronics and optoelectronic components adapted to detect electromagnetic radiation.

The subject of the invention is therefore a structure to detect electromagnetic radiation and a method for manufacturing said detector structure.

PRIOR ART

Electromagnetic radiation detector structures are known to have a nonzero dark current which contributes towards degrading the signal-to noise-ratio. The cause of dark current is the generation of non-photo-generated electron-hole pairs within the structure. This generation chiefly occurs in an active region of the structure in which the photons are absorbed to generate the signal. This region, to maximise the signal, must occupy a large part of the structure volume, generally extending over almost all the surface of the structure and is therefore the cause of major noise.

This applies all the more to structures adapted to operate at infrared wavelengths, these being subjected to major noise on account of the narrow bandgap of the material in which they are formed. A narrow bandgap is favourable for the forming of a tunnelling dark current in the active region.

To overcome this shortcoming, it is known to concentrate electromagnetic radiation within a reduced region of the structure in which the junction is arranged, and hence in the active region. The structure is therefore able to receive electromagnetic radiation on a large surface area without the need for an active region of large volume.

To provide said concentration of electromagnetic radiation and therefore to reduce dark current, it is known in the prior art and in particular from document U.S. Pat. No. 8,125,043 B2, as illustrated in FIG. 1 taken from this document, to couple an absorption layer 1 with a resonant cavity of Fabry-Perot type to form an electromagnetic radiation detector structure.

In this document, the detector structure therefore comprises:
- a substrate having a receiving surface to receive electromagnetic radiation, and in which there is arranged a Fabry-Perot cavity housing at least one first confinement medium 5 of index $n_2$, the Fabry-Perot cavity extending along a thickness of said substrate and leading onto an opening of the receiving surface and being delimited by a reflective medium 7, having at least one mean Fabry-Perot cavity length L;
- an absorption layer 1, configured to absorb electromagnetic radiation and arranged in contact with the Fabry-Perot cavity, the absorption layer 1 having a refractive index $n_s$, said region having a thickness of between $\lambda_0/(4.n_s)$ and $\lambda_0/(20.n_s)$.

According to the teaching of this document, the length of the Fabry-Perot cavity L is substantially equal to $\lambda_0/(n_s)$.

With said configuration it is possible to trap the light received by the absorption layer in a zone 9 of the absorption layer which is delimited by the Fabry-Perot cavity. By aforementioned «trapping of light» it is meant local amplification of the electrical field within zone 9 of the absorption layer.

Nonetheless, while in an ideal configuration of the structure described in document U.S. Pat. No. 8,125,043 B2 good selectivity is obtained if consideration is given to the theoretical configuration illustrated in FIG. 1 and reproduced herein by FIG. 1A, the addition of a passivation layer to passivate the absorption layer 1 in accordance with usual practice of persons skilled in the art, is detrimental on account of the high refractive index of said passivation layer.

This is effectively demonstrated in simulations conducted by the inventor of the variation in absorption of said structure as a function of the wavelength of electromagnetic radiation to be absorbed, the results of which are given in FIG. 1B. The configuration used for these simulations was the following:
- an incident medium 3 for which the refractive index was varied, the inventor having simulated the structure for a refractive index $n_1$ of 1 (curve 501), 1.5 (curve 502), 2 (curve 503), and 2.7 (curve 504) bearing in mind that in a practical application using cadmium mercury tellurides CdHgTe as absorption layer, the incident media able to be used as passivation layer for the absorption layer are generally in cadmium telluride having a refractive index of 2.7;
- an absorption layer 9 formed of cadmium mercury telluride CdHgTe having a refractive index $n_s$ of 3.5 and thickness $h_a$ of 150 nm, i.e. a thickness $h_a$ approximately equal to $\lambda_0/(7.n_s)$ for $\lambda_0$ equalling 3.8 μm;
- a Fabry-Perot cavity of width 0.9 μm, the reflective medium 7 being in gold and the confinement medium in silicon dioxide having a refractive index $n_s$ of 1.5.

As shown in FIG. 1B, the inventor has found that for a structure according to a practical application of the structure in document U.S. Pat. No. 8,125,043 B2:

(i) in accordance with the teaching of this document, the electromagnetic field is confined within an absorption layer 1 and not on the metal providing the reflective medium 7, which allows limiting of losses at the absorption layer/metal interface;

(ii) resonance is not very pronounced meaning that the structure is not very frequency-selective, with relatively moderate maximum quantum efficiency since a maximum absorption of 75% is observed which is obtained with a refractive index of 1 of the incident medium 3;

(iii) an increase in the refractive index of the incident medium, as shown by absorption curves 501 to 504, leads to a drop in selectivity with widening of the absorption peak, and to a drop in maximum absorption.

With regard to item (iii) and as indicated above, with an absorption layer 1 in cadmium mercury telluride CdHgTe, the incident medium 3 to be used for passivation of said absorption layer has a refractive index of approximately 2.7. It follows that said structure in a practical application of document U.S. Pat. No. 8,125,043 B2 does not have the expected selectivity and performance level.

There is therefore a need to develop a detector structure which has optimized absorption and selectivity even in the event of the use of a passivation layer for the absorption layer, as is generally necessary for said detector structure. It will be noted that this issue particularly arises in the case of a structure having an absorption layer in cadmium mercury telluride CdHgTe.

DESCRIPTION OF THE INVENTION

It is the object of the invention to provide a detector structure able to have a passivated absorption region and which, contrary to prior art structures in said configuration, affords optimized absorption rate and frequency selectivity, in particular by associating the absorption region with a Fabry-Perot cavity.

For this purpose, the invention concerns an electromagnetic radiation detector structure adapted to detect electromagnetic radiation in at least a first given range of wavelengths centred around a first wavelength $\lambda_0$, the detector structure comprising:

- a support having a receiving surface arranged to receive at least part of the electromagnetic radiation and in which there is arranged a Fabry-Perot cavity extending at least in part along a thickness of said support, said Fabry-Perot cavity leading into a first opening of said receiving surface and being delimited by at least one conductive medium having negative permittivity of said support, the Fabry-Perot cavity having a mean Fabry-Perot cavity length Wc at least over a first portion of the thickness of the support including the receiving surface and in at least one direction substantially parallel to the receiving surface, the Fabry-Perot cavity housing at least one first confinement medium of refractive index $n_d$;
- an absorption region, configured to absorb electromagnetic radiation, the absorption region having a refractive index $n_a$.

In said detector structure:

- the mean length Wc of the Fabry-Perot cavity is substantially equal to $\lambda_0/(2.n_{eff})$, with $n_{eff}$ being an effective refractive index of a guided mode in the absorption region at the wavelength $\lambda_0$;
- the absorption region has a thickness $h_a$ of less than $\lambda_0/(5.n_a)$;
- the absorption region is housed in the Fabry-Perot cavity at a distance $h_1$ from the first opening of said Fabry-Perot cavity of between $\lambda_0/(50.n_d)$ and $\lambda_0/(4.n_d)$;
- the thickness of the at least one first portion being equal to or greater than $h_1$;
- the refractive index $n_d$ of the at least one first confinement medium being lower than 80% of the refractive index $n_a$ of the absorption region.

In said detector structure, the absorption region—since it is housed in the Fabry-Perot cavity and on account of the difference in index between the absorption region and the confinement region—is not subjected to phenomena of radiation leakage observed with the detector structure in document U.S. Pat. No. 8,125,043 B2.

In the detector structure in document U.S. Pat. No. 8,125,043 B2, the increase in index $n_1$ induced through the use of a passivation layer, leads to deconcentrating or spreading of electrical field distribution outside region 9. This leads to loss of effective absorption in region 9 and therefore to resonance of lesser quality as observed by the inventor in the simulations illustrated in FIG. 1B. In the structure of the invention, however, the presence of the Fabry-Perot cavity allows the avoiding of said de-concentration/spreading of electrical field distribution and hence allows good quality resonance to be maintained.

With said detector structure, it is therefore possible, as with the structure taught in document U.S. Pat. No. 8,125,043 B2, to benefit from the association of the Fabry-Perot cavity with the guided mode in the absorption region, whilst obtaining passivation of the absorption region provided by the incident medium without degradation of resonance in the detector structure.

Therefore, said detector structure is able to exhibit optimized absorption and good selectivity even in a practical configuration of the invention.

By conductive medium having negative permittivity, it is meant that this medium has negative permittivity in at least the first given range of wavelengths. Therefore, said conductive media having negative permittivity comprise metal reflectors, in particular noble metals e.g. gold Au, silver Ag or aluminium Al, optionally doped ionic crystals with a Reststrahlen band comprising the first given wavelength range e.g. silicon carbide SiC for a given wavelength range in the infrared, or a doped semiconductor displaying metallic behaviour in the given wavelength range e.g. amorphous silicon aSi for a given wavelength range in the ultraviolet.

In the foregoing and in the remainder of this document, by a magnitude substantially equal to another given magnitude it is meant that said magnitude has a value differing from said other given magnitude by less than 10%, even less than 5% and advantageously less than 2% of said other given magnitude.

Here and in the remainder of this document, by distance between a first element such as the absorption layer and a second element such as the opening, it is meant the minimum distance between the surfaces of each of said first and second elements facing each other. Therefore, regarding the distance between the absorption layer and the first opening, the distance $h_1$ corresponds to the distance between the surface of the absorption layer and the plane of the receiving surface in which the first opening is arranged.

The Fabry-Perot cavity, on a second portion of the thickness of the support, has at least one dimension in at least one direction substantially parallel to the receiving surface of between 80% and 120% the mean length W of the Fabry-Perot cavity.

This modular width can follow from the technological fabrication means such as described in the practical embodiments below, and can allow minimising of any radiation leakage when a second opening is provided opposite the first opening to optimise the quality of resonance.

The absorption region can be arranged in an absorption layer, said absorption layer extending outside the Fabry-Perot cavity along a plane substantially parallel to the receiving surface.

This extension may derive naturally from the initial multilayer stack from which the detector structure is formed (e.g. a semiconductor stack formed by epitaxy).

The Fabry-Perot cavity, opposite the first opening, can be at least partly closed by a reflective wall configured to reflect electromagnetic radiation, said reflective wall being arranged at a distance $h_3$ from the absorption region of between $\lambda_0/(10.n_d)$ and $\lambda_0/(2.n_d)$, with $n_d$ being the refractive index of the first confinement medium, said distance $h_3$ between the reflective wall and the absorption region preferably being between $\lambda_0/(7.n_d)$ and $\lambda_0/(4.n_d)$ and advantageously substantially equal to $\lambda_0/(5.n_d)$.

The Fabry-Perot cavity, opposite the first opening, has a second opening, the distance h2 between said second opening and the absorption region being greater than $\lambda_0/(2.n_d)$.

The detector structure may comprise at least one adaptation layer of refractive index $n_r$ arranged between the absorption region and the confinement medium, said adaptation layer having a refractive index with a value included between the refractive index $n_d$ of the at least one confinement medium and the refractive index $n_a$ of the absorption layer, the refractive index value of the adaptation layer decreasing from the absorption region towards the confinement medium.

This index gradient can result from technological processes (e.g. thermal annealing) which advantageously allow minimizing of photo-carrier recombination at the interfaces.

The detector structure may comprise a second confinement medium, said second confinement medium being housed in the Fabry-Perot cavity opposite the first opening, with the first confinement medium being inserted between the absorption region and said second confinement medium, the second confinement region having a refractive index $n_{d'}$ lower than the refractive index $n_d$ of the first confinement medium.

With said configuration, it is particularly possible to limit radiation leakage at the second opening when the Fabry-Perot cavity includes one at the opposite the first cavity.

The at least one first confinement medium can also be arranged outside the Fabry-Perot cavity, said first confinement medium in the portion thereof outside the Fabry-Perot cavity forming a coating for the conductive medium having negative permittivity, and having a thickness $h_{1'}$ smaller than $h_1$.

Said configuration is particularly advantageous for an external medium e.g. air ($n_{ext}=1$), the thin layer of the confinement medium then forming a protection/passivation layer and is provided with an antireflective function.

The detector structure may further comprise an incident medium upstream of the support, in the direction of propagation of electromagnetic radiation, the incident medium being configured to receive and to transmit electromagnetic radiation to the support, the incident medium having a refractive index $n_{ext}$ equal to or lower than the refractive index $n_d$ of the first confinement medium, the first confinement medium being entirely contained within the Fabry-Perot cavity.

The invention further concerns a device to detect electromagnetic radiation comprising a plurality of detector structures of the invention, each of the detector structures being adapted to detect electromagnetic radiation in the at least one first given range of wavelengths centred around the first wavelength $\lambda_0$, said detector structures being periodically arranged with periodicity of less than $\lambda_0/n_{ext}$ where $n_{ext}$ is the refractive index of an incident medium upstream of the support, in the direction of propagation of electromagnetic radiation and preferably less than 75% of $\lambda_0/n_{ext}$.

With said configuration, the risks are avoided that diffraction phenomena might perturb detection by the detector structures.

The invention further concerns a method for manufacturing an electromagnetic radiation detector structure adapted to detect electromagnetic radiation in at least one first given range of wavelengths centred around a first wavelength $\lambda_0$, the manufacturing method comprising the following steps:

providing an absorption region of thickness $h_a$ less than $\lambda_0/(5.n_a)$, said absorption region having a refractive index $n_a$ and being associated with at least one confinement medium of refractive index $n_d$ 80% lower than the refractive index $n_a$ of the absorption region;

forming a Fabry-Perot cavity so as, at least partly, to house therein the at least one first confinement medium and the absorption region, the Fabry-Perot cavity being laterally delimited by at least one first conductive medium having negative permittivity with an effective refractive index $n_{eff}$ of a guided mode in the absorption region at the wavelength $\lambda_0$, said Fabry-Perot cavity housing the absorption region at a distance $h_1$ from the first opening of said Fabry-Perot cavity of between $\lambda_0/(50.n_d)$ and $\lambda_0/(4.n_d)$, said forming of the Fabry Perot cavity allowing formation of a support comprising a receiving surface having the first opening into which the Fabry Perot cavity leads, the Fabry-Perot cavity extending at least in part along a thickness of said support and, over at least one first portion of the thickness of the support including the receiving surface and in at least one direction substantially parallel to the receiving surface, having a mean Fabry-Perot cavity length Wc substantially equal to $\lambda_0/(2.n_{eff})$, with $n_{eff}$ being an effective refractive index of a guided mode in the absorption region at the wavelength $\lambda_0$.

With said method it is possible to provide a structure of the invention which de facto benefits from the advantages related to the invention.

At the step to provide the absorption region, there is provided the support comprising a substrate, an absorption layer and passivation layer in succession, at least one among the substrate or passivation layer being intended to form the at least one confinement medium, the step to form a Fabry-Perot cavity comprising the following sub-steps of:

locally etching the support to form at least one first penetration corresponding to the conductive medium having negative permittivity, the at least one penetration delimiting a cavity at least partly housing the confinement medium and absorption region;

filling the at least one penetration with the material of the conductive medium having negative permittivity, to form said conductive medium having negative permittivity and hence the Fabry-Perot cavity.

Said formation step allows the forming of the Fabry-Perot cavity with a reduced number of steps.

Provision may also be made for the steps of:

providing a second support comprising a control circuit, said control circuit having at least one contact pad;

connecting the detector structure to the control circuit by hybridizing the conducting reflective medium to the first contact pad via indium bump technology.

Prior to the localised etching step, the following steps are provided:

providing a second support comprising a control circuit, said control circuit having at least one contact pad;

bonding the first support onto a surface of the first support comprising the at least one contact pad;

wherein at the sub-step of localised etching, the at least one penetration opens onto the contact pad, so that at the sub-step to fill the at least one penetration the conductive material having negative permittivity is also deposited in contact with the at least one contact pad.

These two possibilities allow the associating of the detector structure of the invention with a second support comprising a control circuit.

BRIEF DESCRIPTION OF THE FIGURES

The present invention will be better understood on reading the description of examples of embodiment, given solely for illustration purposes and in no way limiting, with reference to the appended drawings in which.

Equivalent, similar or identical parts in the different Figures carry the same reference numbers for facilitated cross-referencing from one Figure to another.

The different parts illustrated in the Figures are not necessarily shown to uniform scale, for better legibility of the Figures.

The different possibilities (variants and embodiments) are to be construed as not being exclusive of each other and can be combined.

It will be generally noted in the invention that by lateral cross-sectional view and by transverse view, it is meant above and in the remainder of this document a cross-sectional view respectively along a plane perpendicular to a plane of the detector structure generally corresponding to the plane of the absorption layer, and along a plane parallel to said plane of the detector structure. This remark similarly applies to the term transverse cross-section.

DETAILED DESCRIPTION OF PARTICULAR EMBODIMENTS

Figure 2:
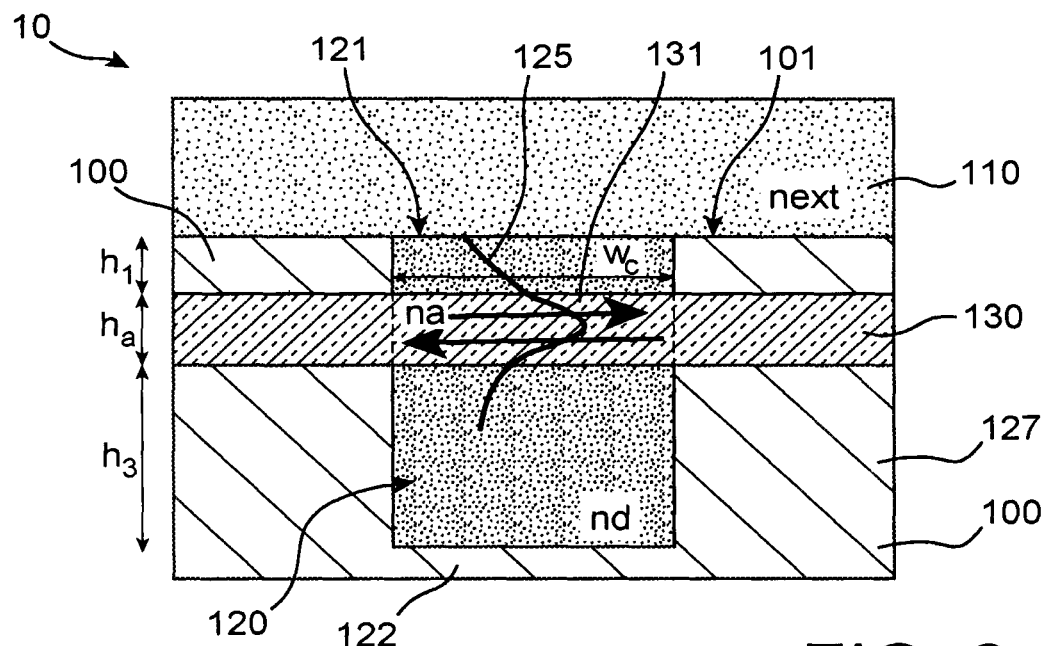
FIG. 2 schematically illustrates a structure along the principle of the invention.

FIG. 2 schematically illustrates a detector structure 10 along the principle of the invention, said detector structure 10 being adapted to detect electromagnetic radiation in at least one first given range of wavelengths centred around a first wavelength λ0.

Said detector structure 10 more particularly targets the detection of electromagnetic radiation in the range of infrared wavelengths. Therefore, the different values indicated in the embodiments described below concern this practical application where the range of wavelengths concerned is the mid-infrared i.e. from 3 to 5 μm. These values are evidently given as non-limiting example, it being well within the reach of skilled persons, from this disclosure, to adapt these values so that said detector structure 10 can be used to allow optimised detection of electromagnetic radiation in a wavelength range other than the infrared range.

Principle of the Invention

Said detector structure 10 along the principle of the invention comprises:
  an incident medium 110 via which the detector structure receives electromagnetic radiation, the incident medium having a refractive index $n_{ext}$;
  a support 100 having a receiving surface 101 arranged to receive at least part of the electromagnetic radiation transmitted by the incident medium 110, and in which there is arranged a Fabry-Perot cavity 120 extending at least in part along a thickness of said support, said Fabry-Perot cavity 120 leading into a first opening 121 of said receiving surface and being delimited by a least conductive medium having negative permittivity 127 of said support 100, the Fabry-Perot cavity 120 having a mean Fabry-Perot cavity length Wc on at least one first portion of the thickness of the support 100 including the receiving surface 101 and in at least one direction substantially parallel to the receiving surface 101, the Fabry-Perot cavity housing at least one first confinement medium 125 having a refractive index $n_d$ equal to or higher than the refractive index $n_{ext}$ of the incident medium;
  an absorption region 131 housed in the Fabry-Perot cavity such that its upper part lies at a distance h1 from the first opening of between $\lambda_0/(50.n_d)$ and $\lambda_0/(4.n_d)$, the absorption region 131 being configured to absorb electromagnetic radiation and having a refractive index $n_a$, and is of thickness $h_a$ less than $\lambda_0/(5.n_a)$.

It will be noted that in said configuration of the invention, the incident medium 110 lies upstream of the support 100, in the direction of propagation of electromagnetic radiation, and that the part of electromagnetic radiation received by the support is a part transmitted by said confinement medium. In addition, in the configuration along the principle of the invention, the first confinement medium 125 is entirely contained within the Fabry-Perot 120 cavity.

In said detector structure 10, the refractive index $n_d$ of the at least one first confinement medium is lower than 80% of the refractive index $n_a$ of the absorption region, and the at least one Fabry-Perot cavity mean length Wc is substantially equal to $\lambda_0/(2.n_{eff})$, with $n_{eff}$ being the refractive index of a guided mode in the absorption region 131 at the wavelength $\lambda_0$.

It will also be noted that the detector structure 10 illustrated in FIG. 2 has a configuration according to a first possibility of the invention in which the Fabry-Perot cavity 120, opposite the first opening 121, is closed by a reflective wall 122 configured to reflect electromagnetic radiation so as to limit radiation leakage without perturbing the optical mode propagating in the Fabry-Perot cavity 120.

Evidently, the incident medium 110 and confinement medium 125 are at least partly transparent, preferably substantially transparent, in the range of wavelengths to be detected.

Regarding the sizing of the Fabry-Perot cavity 120 and more specifically the Fabry-Perot cavity mean length Wc, and with respect to the configuration of the invention in which the absorption region has a thickness $h_a$ significantly smaller than the wavelength $\lambda_0$ of the electromagnetic radiation to be absorbed and in which the absorption region in the Fabry-Perot cavity is solely surrounded by the first confinement medium 125, the effective index $n_{eff}$ of the guided mode in the active region 131 propagating in a plane substantially parallel to the receiving surface can be estimated from the following equation:

$$n_{eff}^2 = n_d^2\left[1 + \left(\left(\frac{n_a}{n_d}\right)^2 - 1\right)^2 \left(\pi \cdot \frac{h_a n_d}{\lambda_0}\right)^2\right]$$

$n_d$ being the refractive index of the confinement medium 125, $n_a$ being the refractive index of the absorption layer 131, $h_a$ being the thickness of the absorption layer 131.

It will be noted that said equation, allowing estimation of the effective index of a guided mode in the absorption region 131, was determined for a waveguide having the same configuration as that of the absorption region and surrounded on either side by the confinement medium.

Evidently, as a variant, said value of the effective index $n_{eff}$ can be determined in accordance with the general knowledge of skilled persons using routine numerical simulations.

Figure 3:
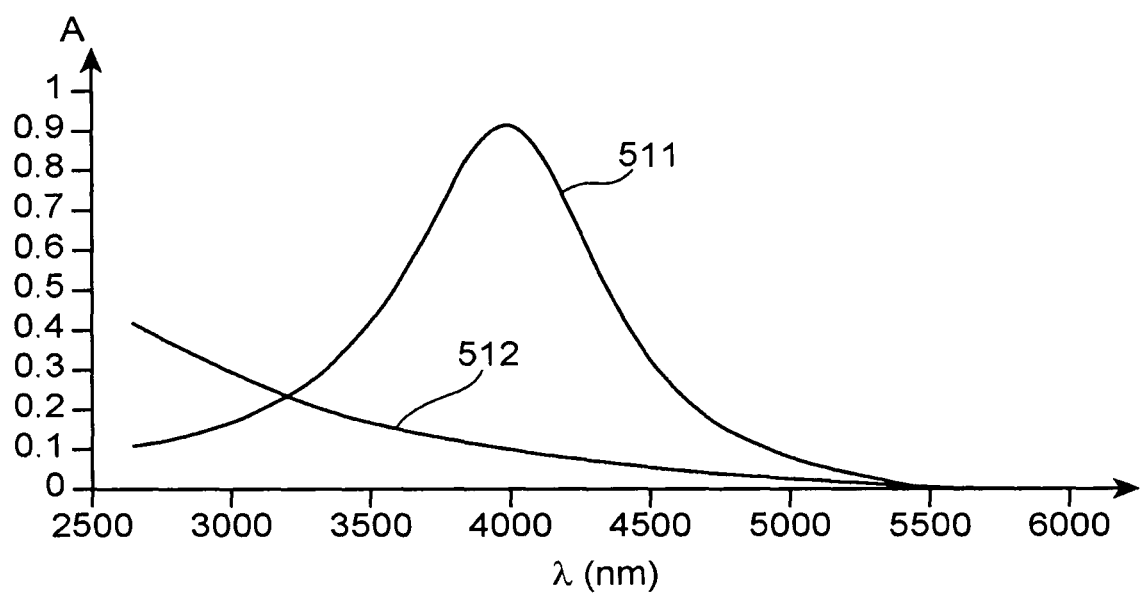
FIG. 3 is a graph illustrating the variation in absorption rate as a function of wavelength of the electromagnetic radiation to be absorbed, for a structure along the principle of the invention illustrated in FIG. 2 in parallel with the absorption rate of an absorption layer identical to that of the structure in FIG. 2 deposited on a gold surface.

As shown in FIG. 3, said detector structure 10 has good selectivity and a particularly high absorption rate.

FIG. 3 is a graph showing the variation in absorption rate (A) as a function of the wavelength (λ) of electromagnetic radiation for a detector structure 10 according to the configuration illustrated in FIG. 2, in parallel with the variation in absorption rate (A) of an absorption layer similar to that of said detector structure 10 arranged on the surface of a layer in gold Au. This absorption rate was simulated by the inventor for a structure 10 having the following configuration:
  air as incident medium, the refractive index $n_{ext}$ of said incident medium 110 being 1;
  operating temperature of 77 K;
  an absorption layer 130 and an absorption region 131 in cadmium mercury telluride $Cd_xHg_{1-x}Te$ with x equalling 0.29, which corresponds to a bandgap of 0.227 eV and a refractive index $n_a$ of 3.45, and thickness $h_a$ of 150 nm;
  a Fabry-Perot cavity 120 having a Fabry-Perot cavity length of 1150 nm, with a distance $h_1$ between the first opening 121 and the absorption layer 130 comprising the absorption region 131 of 350 nm, and the distance $h_3$ between the absorption region 131 and the reflective wall 122 being 500 nm, a first conductive medium having negative permittivity 127 in gold Au.

It can therefore be seen in FIG. 3 that said detector structure 10 has a maximum absorption rate 511 of 91.5% at a wavelength of 4 µm with a mid-height width in the range of 3.5 µm to 4.3 µm. This result is to be compared with the absorption rates 503 obtained for a prior art detector structure shown in FIG. 2 and for a similar absorption layer 130 simply arranged in contact with layer of gold Au which acts as mirror.

According to the principle of the invention, a detector structure 10 of the invention can be formed following a method comprising the following steps:

providing an absorption region 131 with a thickness of less than $\lambda_0/(5.n_a)$, said absorption region having a refractive index $n_a$ and being associated with at least one confinement medium 125 having a refractive index $n_d$ lower than 80% of the refractive index $n_a$ of the absorption region 120;

forming a Fabry-Perot cavity 120 so as to house the at least one first confinement medium 125, the Fabry-Perot cavity 120 extending longitudinally from at least one first opening 121 and being delimited laterally by at least one first conducting reflective medium 127 with at least one mean Fabry-Perot cavity length Wc substantially equal to $\lambda_0/(2.n_{eff})$, with an effective refractive index $n_{eff}$ of a guided mode in the absorption region at wavelength $\lambda_0$, said Fabry-Perot cavity housing the absorption region at a distance $h_1$ from the first opening of said cavity of between $\lambda_0/(50.n_d)$ and $\lambda_0/(4.n_d)$, even between $\lambda_0/(20.n_d)$ and $\lambda_0/(8.n_d)$, said forming of the Fabry Perot cavity allowing the formation of a support 100 having a receiving surface 100 comprising the first opening 121 into which the Fabry Perrot cavity 120 leads, the Fabry-Perot cavity 120 extending at least in part along a thickness of said support 100 and having, on at least one first portion of the thickness of the support 100 including the receiving surface 101 and in at least one direction substantially parallel to the receiving surface 101, a mean Fabry-Perot cavity length Wc substantially equal to $\lambda_0/(2.n_{eff})$, with $n_{eff}$ being an effective refractive index of a guided mode in the absorption region 131 at wavelength $\lambda_0$, forming an incident medium 110 having a refractive index $n_{ext}$ equal to or lower than the refractive index $n_d$ of the at least one confinement medium 125, the incident medium 110 configured to receive electromagnetic radiation and with an arrangement adapted so that the receiving surface 101 is arranged to receive at least part of the electromagnetic radiation transmitted by the incident medium 110.

Figure 4A:
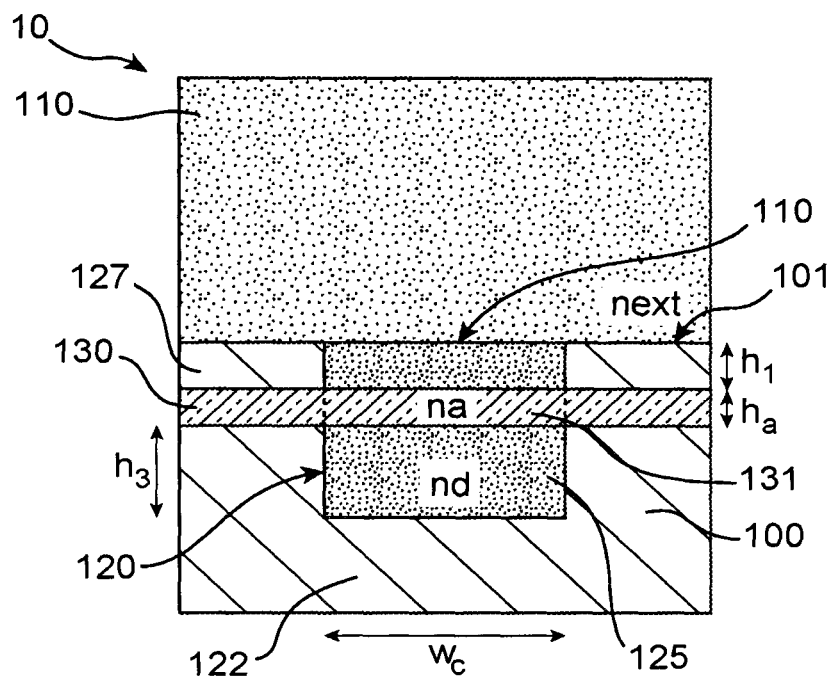
FIGS. 4A to 4C schematically illustrate a structure according to a first possibility of the invention wherein the structure comprises a Fabry-Perot cavity closed at one end, FIGS. 4A to 4C respectively and schematically illustrating a cross-sectional view of said structure, an underside view of said structure and a mapping of the electric field in said structure along the cross-section of the detector structure shown in FIG. 4A.
Figure 4B:
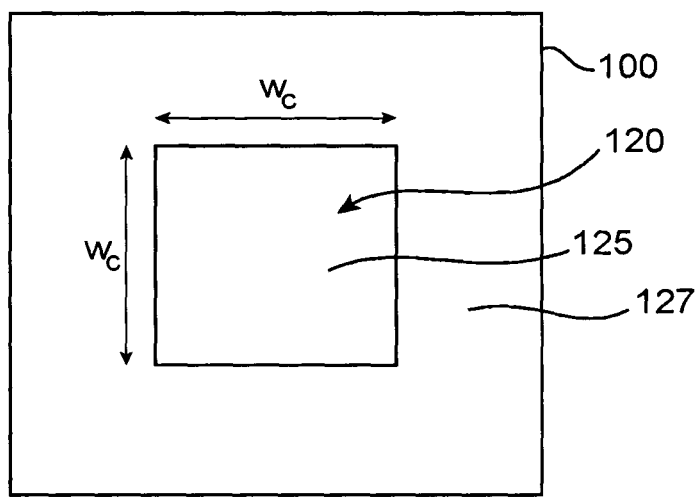
Figure 4C:
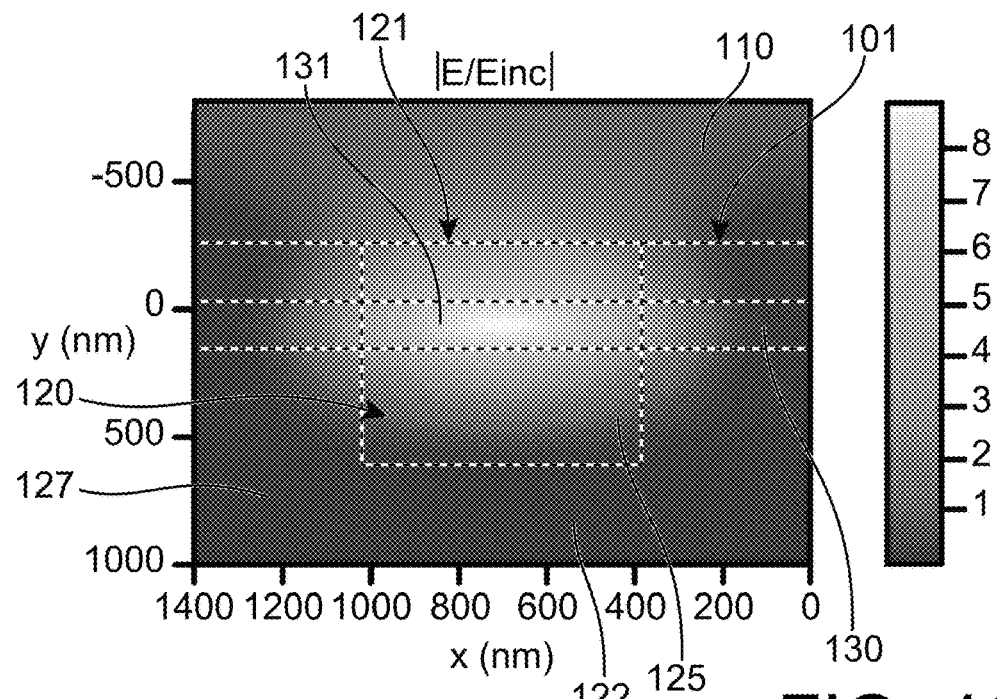
Figure 5A:
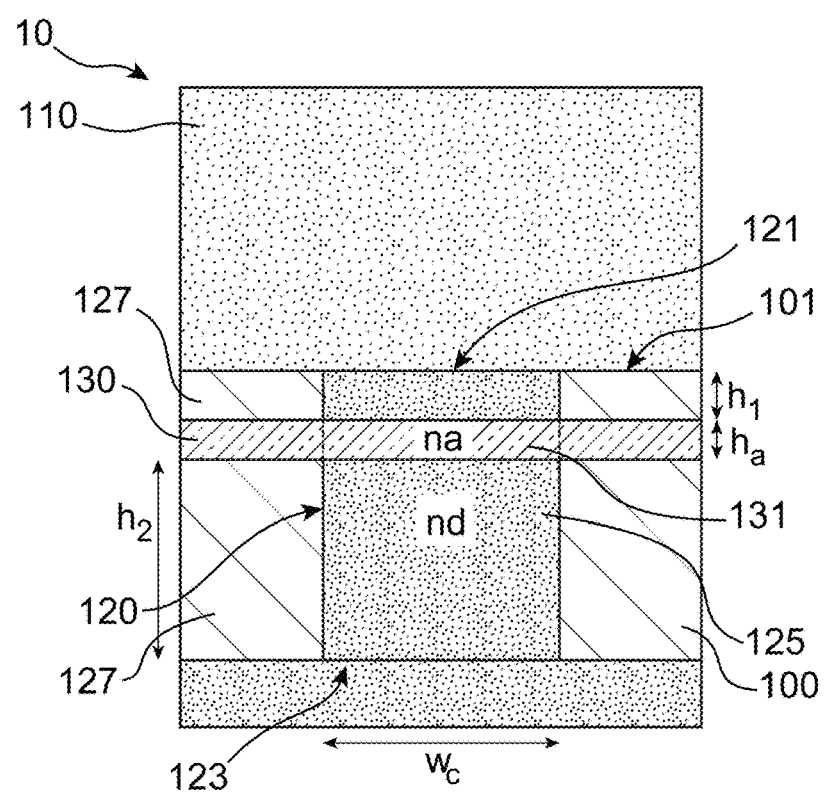
FIGS. 5A and 5B schematically illustrate a structure according to a second possibility of the invention wherein the structure comprises a Fabry-Perot cavity open at its two ends, FIGS. 5A and 5B respectively illustrating a cross-sectional view of said structure and a mapping of the electric field in said structure along the cross-section of the detector structure shown in FIG. 5A.
Figure 5B:
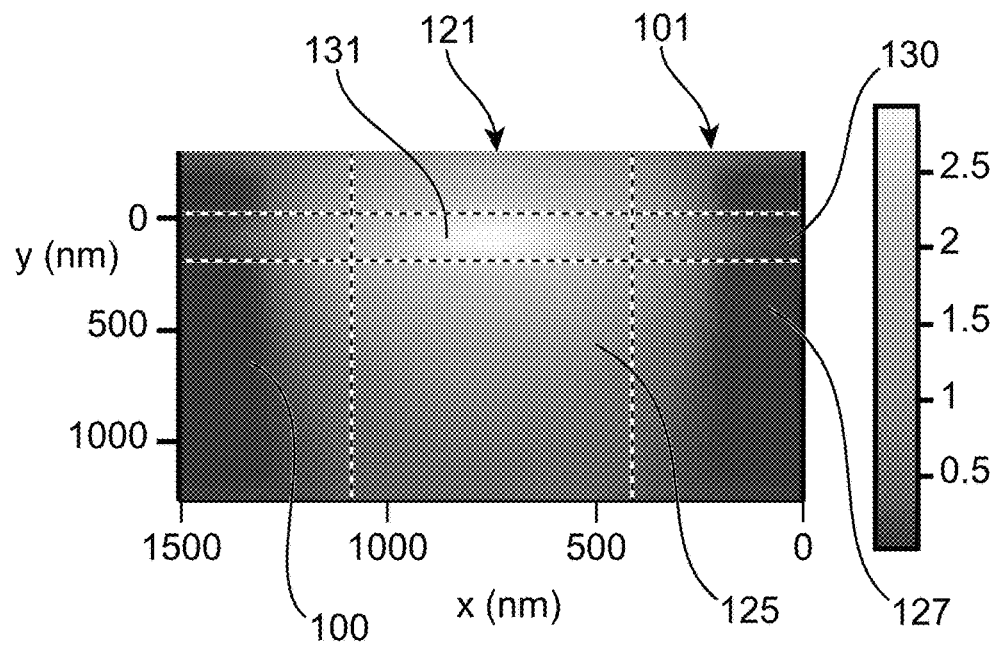

FIGS. 4A to 4C illustrate a detector structure 10 according to the first possibility conforming to FIG. 3. FIGS. 5A and 5B illustrate a detector structure 10 according to a second possibility of the invention. The second possibility of the invention differs from the first possibility of the invention in that the Fabry-Perot 120 cavity in lieu and stead of the reflective wall 122 has a second opening opposite the first opening.

The invention therefore offers two separate possibilities:
a first possibility illustrated in FIG. 4A and conforming to the possibility reproduced in FIG. 2, in which the Fabry-Perot cavity 120 is provided with a reflective wall 122 opposite the first opening 122;
a second possibility, illustrated in FIG. 5A, in which the Fabry-Perot cavity 120 has a second opening 123 opposite the first opening 122.

First Possibility of the Invention:

It will also be noted that the detector structure 10 illustrated in FIG. 4A has a configuration according to a first possibility of the invention in which the Fabry-Perot 120 cavity, opposite the first opening 121, is closed by a reflective wall 122 configured to reflect electromagnetic radiation.

According to this first possibility, as illustrated in FIG. 4A, the reflective wall 122 is preferably arranged at a distance $h_3$ from the absorption region of between $\lambda_0/(10.n_d)$ and $\lambda_0/(2.n_d)$, with $n_d$ being the refractive index of the first confinement medium, said distance $h_3$ between the reflective wall 122 and the absorption region being more advantageously between $\lambda_0/(7.n_d)$ and $\lambda_0/(4.n_d)$, distance h3 being further advantageously in the region of and even substantially equal to $\lambda_0/(5.n_d)$.

Therefore, according to this first possibility of the invention, the Fabry-Perot cavity extends over a portion of the thickness of the support 100 which is equal to the sum of distance h1 between the first opening 121 and the absorption region 131, of thickness $h_a$ of the absorption region and of distance $h_3$ between the absorption region 131 and the reflective wall 122.

FIG. 4B allows exemplification of a shape of the transverse cross-section of a detector structure according to the invention allowing optimization of Fabry-Perot resonance. According to this example, the Fabry-Perot cavity 120 has a square transverse cross-section, the side of said square corresponding to the Fabry-Perot cavity length Wc. Evidently, as shown in the remainder of this document, other cross-sectional shapes of the Fabry-Perot cavity 120 can be envisaged, such as annular or circular cross-sections, whilst still remaining within the scope of the invention.

To illustrate the confinement phenomenon of electromagnetic radiation allowed by the configuration of the invention, FIG. 4C shows mapping of the electric field along a lateral cross-section of a detector structure 10 for electromagnetic radiation corresponding to the resonance length of the Fabry-Perot cavity, such as illustrated in FIG. 4A. It can be seen that the coupling between the Fabry-Perot cavity 120 and the absorption region 131 allows confining of electromagnetic radiation in the absorption region 131.

Second Possibility of the Invention:

According to the second possibility of the invention illustrated in FIG. 5A, the Fabry-Perot cavity 120 of the detector structure 10 comprises a second opening 123 opposite the first opening 121, the distance $h_2$ between said second opening 123 and the absorption region 131 being greater than $\lambda_0/(2.n_d)$.

It will be noted that, similar to the detector structure 10 according to the first possibility, the Fabry-Perot cavity 120 of the detector structure in the second possibility can have a square transverse cross-section, the side of said square corresponding to the Fabry-Perot cavity length Wc, other cross-sectional shapes of the Fabry-Perot cavity 120 possibly being envisaged.

Similar to the first possibility of the invention and FIG. 4C, FIG. 5B gives demonstration of the confinement phenomenon of electromagnetic radiation allowed by the configuration of the invention. FIG. 5B gives mapping of the electric field along a lateral cross-section of a detector structure 10 for electromagnetic radiation corresponding to the resonance length of the Fabry-Perot cavity, such as illustrated in FIG. 5A. It can be seen that with said detector structure, the coupling between the Fabry-Perot cavity 120 and the absorption region 131 allows confinement of electromagnetic radiation in the absorption region 131.

In addition, whether for a structure in the first possibility or for a structure in the second possibility, the inventor has also shown that absorption of electromagnetic radiation for a detector structure 10 of the invention has scarce dependence on the angle of incidence of electromagnetic radiation. Therefore, the detector structure 10 of the invention has particularly high angle acceptance on account of the fact that the principle of the invention is based on the use of localised resonance provided by the association of a waveguide mode of the absorption region 131 and the Fabry-Perot cavity 120.

Therefore, to benefit from said angle acceptance it can be envisaged according to one non-illustrated possibility of the invention, to combine said detector structure 10 with a light-concentrating system such as a converging lens.

Sizing of a Structure According to the Invention

To allow identification of relevant dimensions in the invention, the inventor has configured the variation in absorption (A) of a structure of the invention as a function of some dimensions of a structure according to the invention.

Figure 1A:
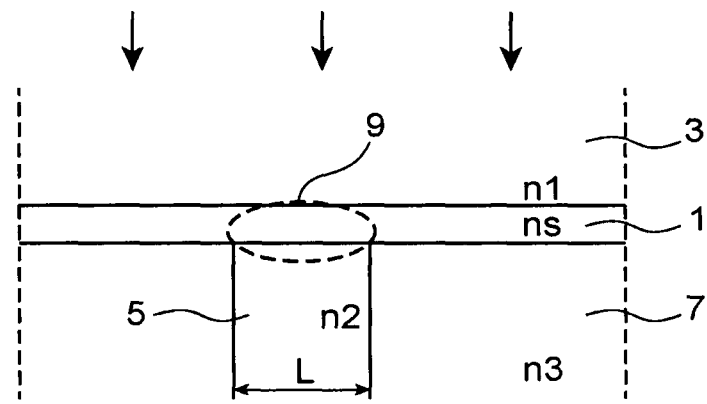
FIGS. 1A and 1B respectively give an illustration of a prior art structure and a graph of absorption rate, as a function of wavelength of electromagnetic radiation to be absorbed, able to be obtained with said structure.
Figure 1B:
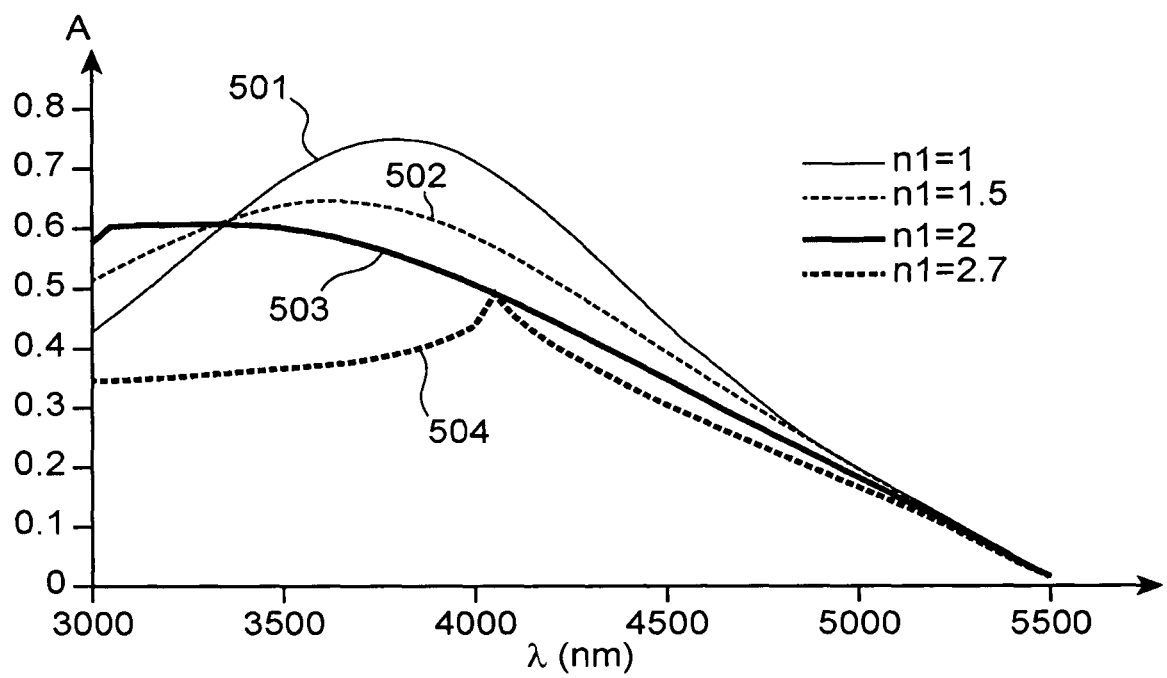
Figure 6:
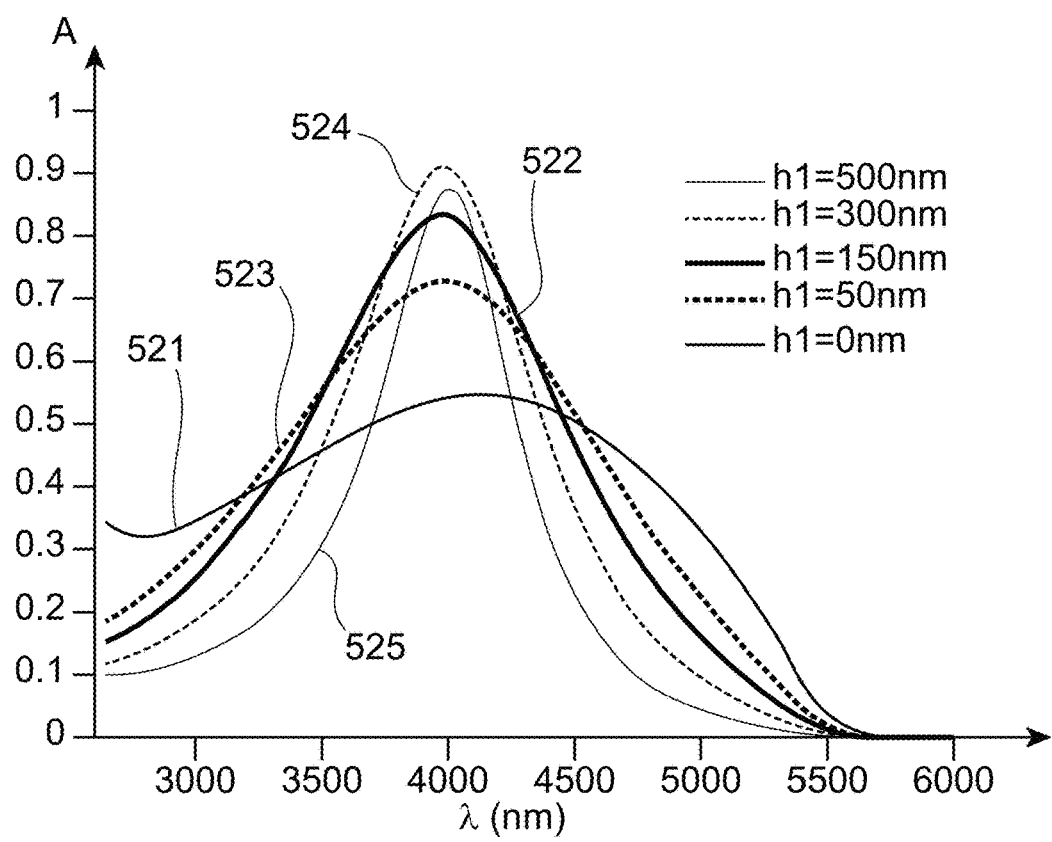
FIG. 6 is a graph illustrating the variation in absorption of a structure of the invention as a function of the wavelength of electromagnetic radiation for a distance $h_1$ increasing between an absorption region and an opening of the Fabry-Perot cavity.

Therefore FIG. 6, for a detector structure 10 according to the first possibility, illustrates the variation in absorption rate as a function of the wavelength of electromagnetic radiation to be absorbed, for a distance h1 between the first opening 121 and the absorption region 131 of respectively 0 nm (curve 521), 50 nm (curve 522), 150 nm (curve 523), 300 nm (curve 524) and 500 nm (curve 525). It can be seen in FIG. 6 that for a relatively short distance between the first opening 121 and the absorption region 131, resonance is little pronounced and the absorption rate is relatively low. For example, curve 521 corresponds to the prior art configuration such as illustrated in FIG. 1. On the other hand, as soon as said distance $h_1$ increases, as illustrated in FIG. 6, the absorption rate exhibits a more pronounced peak and hence more selective as shown in particular by curve 523. However, as soon as distance $h_1$ exceeds 300 nm, as shown in FIG. 6 by curve 525, a drop is observed in the absorption rate related to strong radiation leakage.

The inventor has therefore identified that this distance $h_1$ of the first opening 121 of said cavity must be between $\lambda_0/(50.n_d)$ and $\lambda_0/(4.n_d)$, even between $\lambda_0/(20.n_d)$ and $\lambda_0/(8.n_d)$, to optimise absorption rate and wavelength selectivity of said detector structure. Conforming to the principle of the invention, the opening of the cavity 120 is sub-wavelength (the mean cavity length Wc is less than $\lambda_0/(2.n_d)$), which implies entry of incident electromagnetic radiation into the cavity in the form of an evanescent wave. The coupling of this wave with the absorption region 131 must therefore be optimised to obtain efficient resonance, which entails adjustment of distance $h_1$. In other words, if $h_1$ is too large, evanescent light can no longer reach the absorption region, and if $h_1$ is too small the structure displays stronger radiation leakage having a negative impact on quality of resonance.

Figure 7:
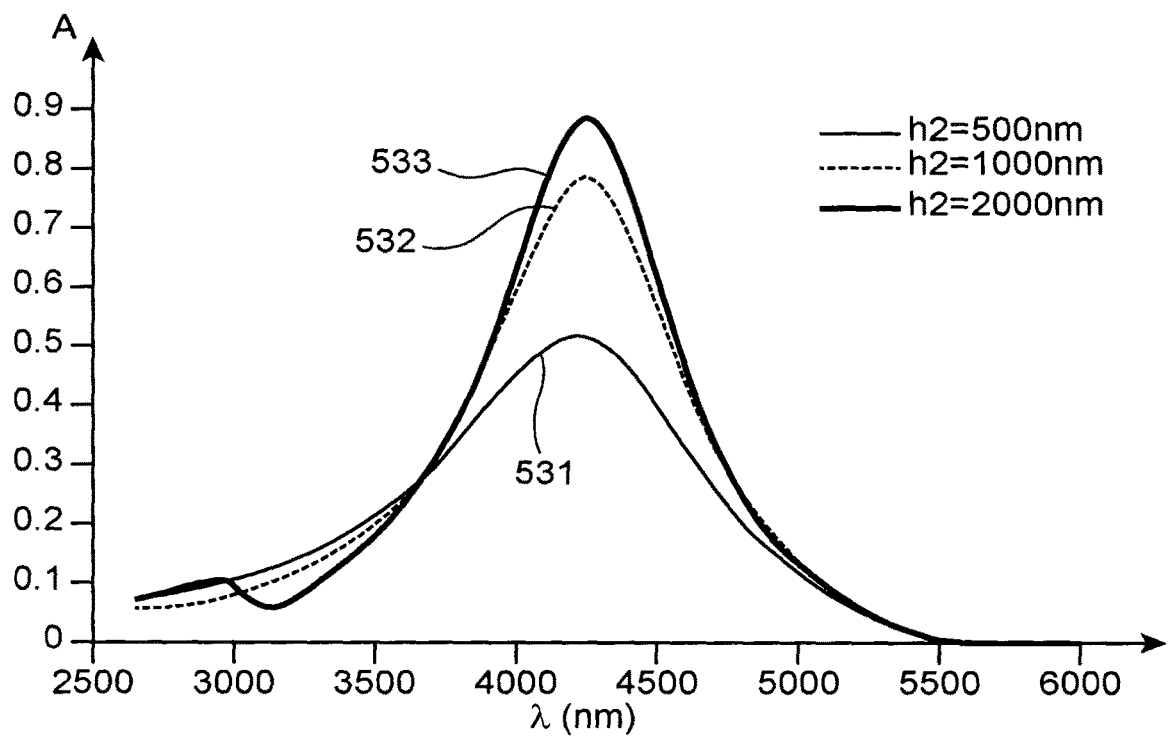
FIG. 7 is a graph illustrating the variation in absorption of a structure according to the second possibility of the invention as a function of the wavelength of electromagnetic radiation for a distance $h_2$ increasing between a second opening of the structure and the absorption region.

Regarding the sizing of the Fabry-Perot cavity, the inventor has also found that for a configuration according to the second possibility of the invention, as shown by the graphs in FIG. 7, the distance $h_2$ between the absorption region 131 and the second opening 123 must be sufficient to prevent radiation leakage of electromagnetic radiation via the second opening 123 and thereby to trap electromagnetic radiation in the absorption region 131.

FIG. 7 is a graph illustrating absorption rate as a function of the wavelength of electromagnetic radiation in a detector structure 10 according to the second possibility, for a respective distance $h_2$ between the absorption region 131 and the second opening 123 of 500 nm (curve 531), 1000 nm (curve 532) and 2000 nm (curve 533). It is therefore noted that, while for a distance h2 of 500 nm the absorption peak only reaches 52% for 500 nm, it reaches 78% at 1000 nm and 88% at 2000 nm. The inventor was therefore able to identify that for the second possibility, a distance $h_2$ between the absorption region 131 and the second opening 123 greater than $\lambda_0/(2.n_d)$ allows signification limiting of electromagnetic radiation leakage via the second opening 123.

The inventor has also identified a similar phenomenon for distance $h_3$ between the absorption region 131 and the reflective wall 122 for the configuration according to the first possibility of the invention, namely the closing of the cavity by a reflective wall 122. It was effectively observed that if the distance $h_3$ between the absorption region 131 and the reflective wall 122 becomes too small, the reflective wall perturbs the guided mode in the region 131 and involves strong offsetting of the resonance wavelength towards high frequencies outside the desired spectral range. Similarly, for a distance $h_3$ between the absorption region 131 and the reflective wall 122 that is too great, the benefit of the reflector is lost i.e. better concentration of electrical field distribution on region 131.

Therefore, the inventor for the first possibility was able to identify a distance $h_3$ between the absorption region 131 and the reflective wall 122 of between $\lambda_0/(10.n_d)$ and $\lambda_0/(2.n_d)$, said distance $h_3$ entre between the reflective wall and the absorption region preferably being between $\lambda_0/(7.n_d)$ and $\lambda_0/(4.n_d)$ and more advantageously substantially equal to $\lambda_0/(5.n_d)$.

Figure 8A:
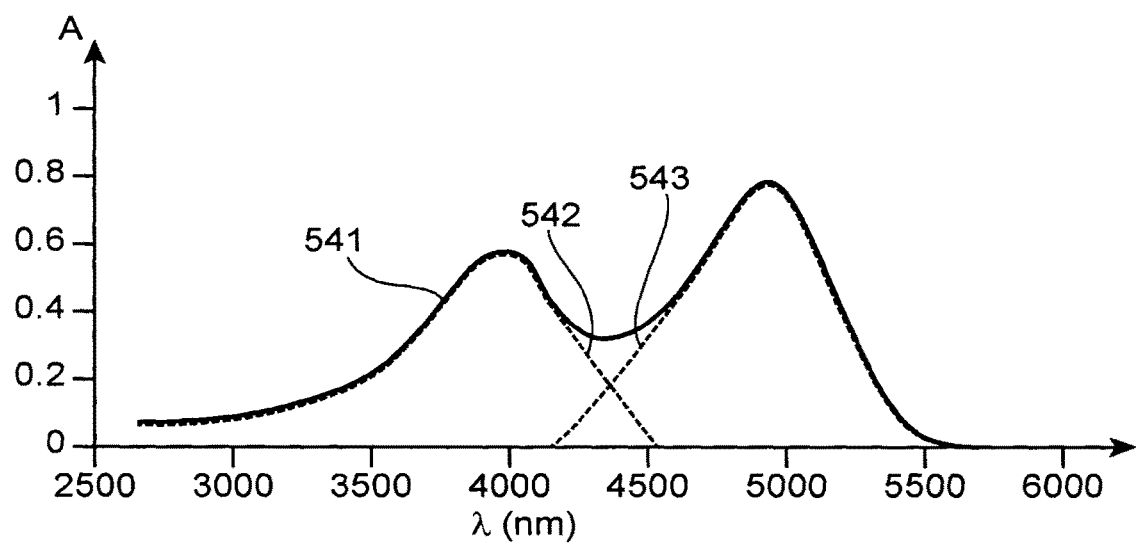
FIGS. 8A to 8C respectively illustrate the variation in absorption of a structure comprising two Fabry-Perot cavities, each having an absorption region arranged in an absorption layer common to said cavities, as a function of the wavelength of electromagnetic radiation, a mapping of the electromagnetic field in said structure for electromagnetic radiation corresponding to the resonance wavelength of the first cavity, and a mapping of the electromagnetic field in said structure for electromagnetic radiation corresponding to the resonance wavelength of the second cavity.
Figure 8B:
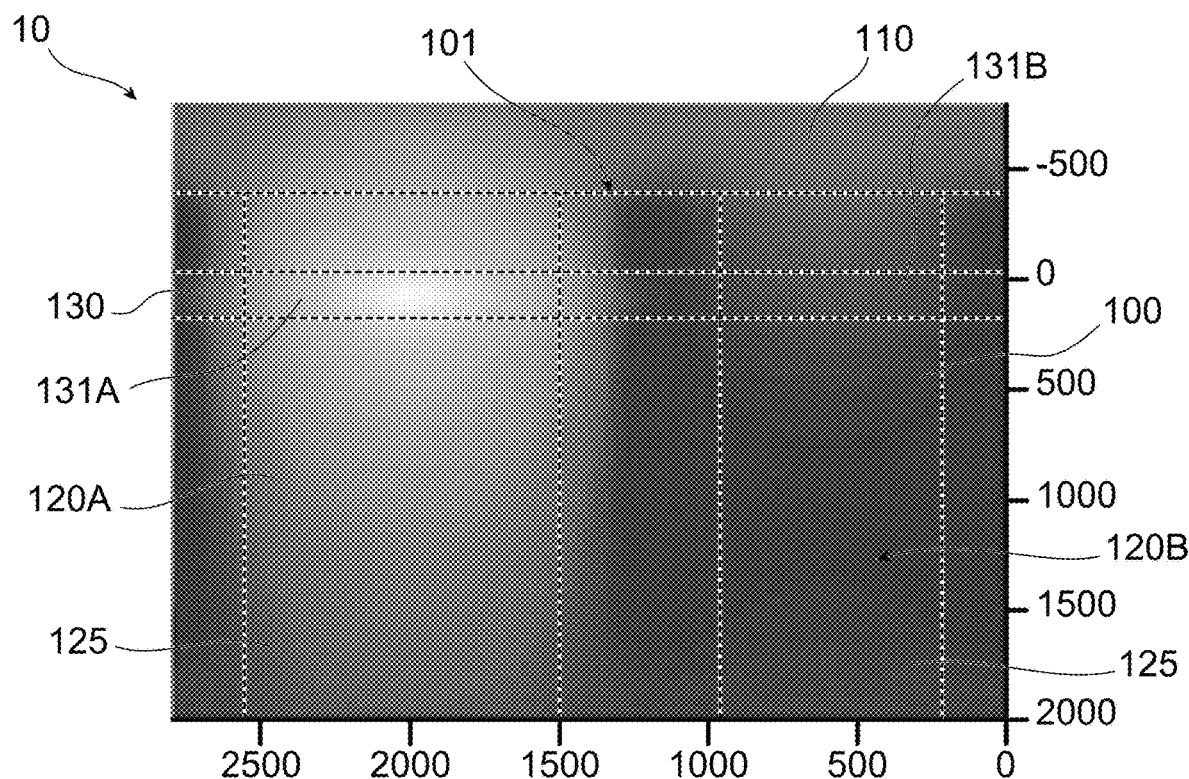
Figure 8C:
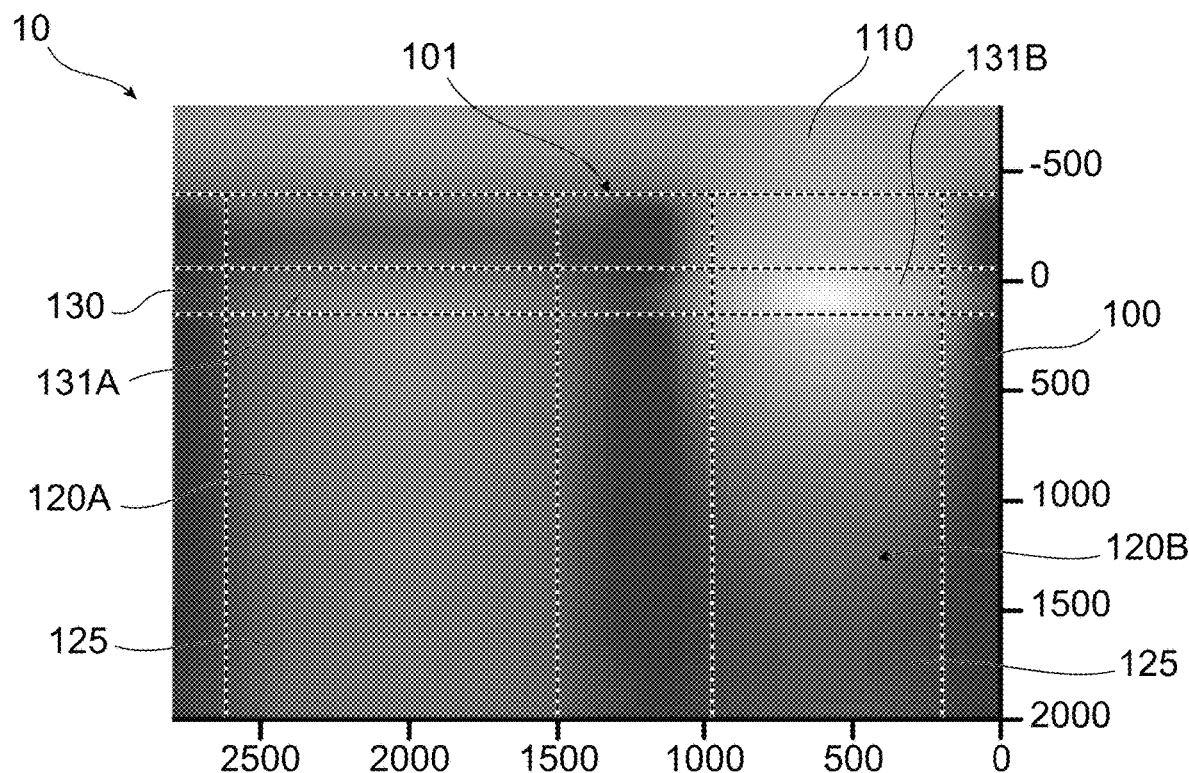

It is to be noted that the principle of the invention, as shown in connection with FIGS. 8A to 8C for the case in which the absorption region 131 is included in an absorption layer 130, also allows the combining of two Fabry-Perot cavities 120A, 120B with absorption regions 131A, 131B, to afford a detector structure having an increased detection wavelength range. FIGS. 8A to 8C illustrate this possibility.

According to this possibility, the detector structure 10 is therefore provided with an absorption layer 120 including two parts forming a first and a second absorption region 131A, 131B respectively housed in a first and second Fabry-Perot cavity 120A, 120B. According to this possibility, each of the first and second Fabry-Perot cavity 120A, 120B has a mean Fabry-Perot cavity length $Wc_A$, $Wc_B$ specific thereto, and hence a resonance wavelength specific thereto. In this manner, as shown in FIG. 8A giving a curve 541 illustrating the absorption rate of said detector structure as a function of the wavelength of electromagnetic radiation to be absorbed, the first and second absorption region 131A, 131B allow absorption of electromagnetic radiation in a first and second range of wavelengths corresponding to the absorption peaks given by curve 541. It will be noticed in this FIG. 8A that the absorption curve 541 corresponds to the sum of absorption curves 542, 543 able to be obtained for the first and second absorption regions 131A, 131B.

This multiple resonance phenomenon is shown in FIGS. 8B and 8C which give mapping of the electromagnetic field in a structure of the invention respectively for electromagnetic radiation corresponding to the resonance wavelength of the first Fabry-Perot cavity 120A and electromagnetic radiation corresponding to the resonance wavelength in the second Fabry-Perot cavity 120B. It can be seen in these two Figures that according to the principle of the invention, for electromagnetic radiation corresponding to the resonance wavelength of the first Fabry-Perot cavity 120A, and respectively of the second Fabry-Perot cavity 120B, electromagnetic radiation finds itself confined in the first absorption region 131A and respectively in the second absorption region 131B, corresponding to said Fabry-Perot cavity, the second absorption region 131B and respectively the first absorption region 131A corresponding to the other Fabry-Perot cavity not having any particular confinement for said electromagnetic radiation.

Therefore, in conformity with this possibility of the invention it is possible to provide a detector structure 10 of the invention having an extended wavelength range through the combining of several Fabry-Perot cavities 120A, 120B and an absorption layer 130 intercepted by said Fabry-Perot cavities 120A, 120B.

Variants of the Invention

Figure 9A:
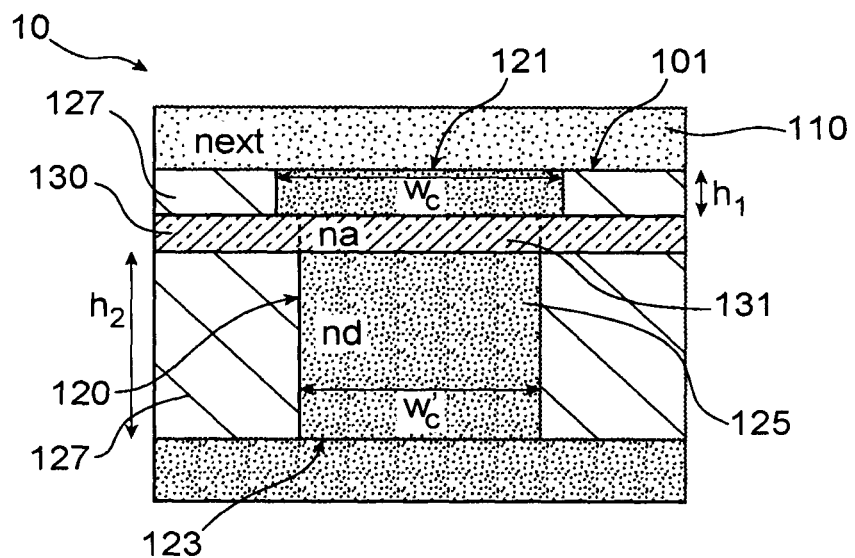
FIGS. 9A to 9H are lateral cross-sectional views respectively illustrating a structure according to a first variant of the invention in which the Fabry-Perot cavity is of different width between a first portion lying between the first opening of the cavity and the absorption region, and a second portion lying between the absorption region and the second opening of the cavity; a second variant of the invention in which the absorption layer is discontinuous and in which the cavity is partly closed; a third variant of the invention in which the absorption region is locally discontinuous or indented; a fourth variant of the invention in which the second portion of the Fabry-Perot cavity comprises a second confinement medium having a refractive index lower than that of the first confinement medium; a fifth variant of the invention in which the material of the confinement medium also forms passivation of the structure; a sixth variant of the invention in which the absorption layer has an optical index gradient with the adjacent confinement medium; a seventh variant in which solely the absorption region has an optical index gradient with the adjacent confinement medium; and an eighth variant in which the Fabry-Perot cavity is of variable cross-section over the first portion of its height.
Figure 9B:
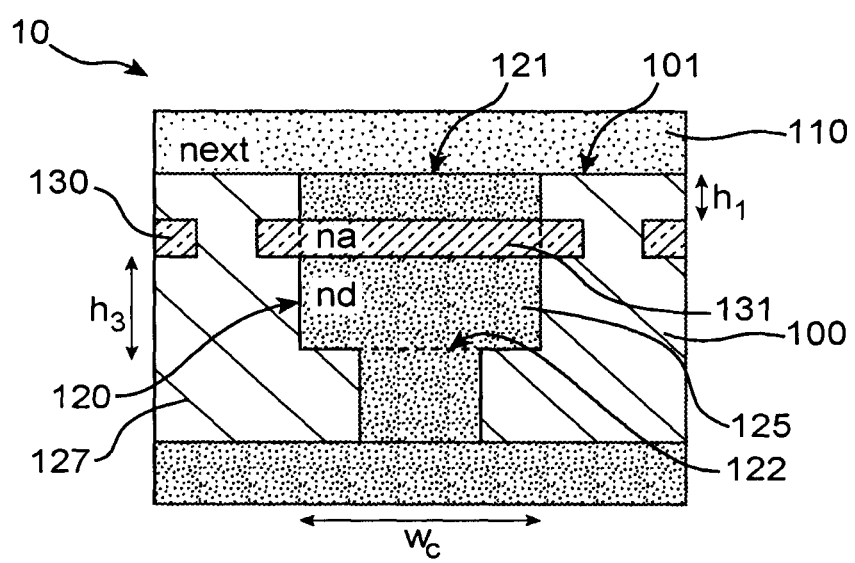
Figure 9C:
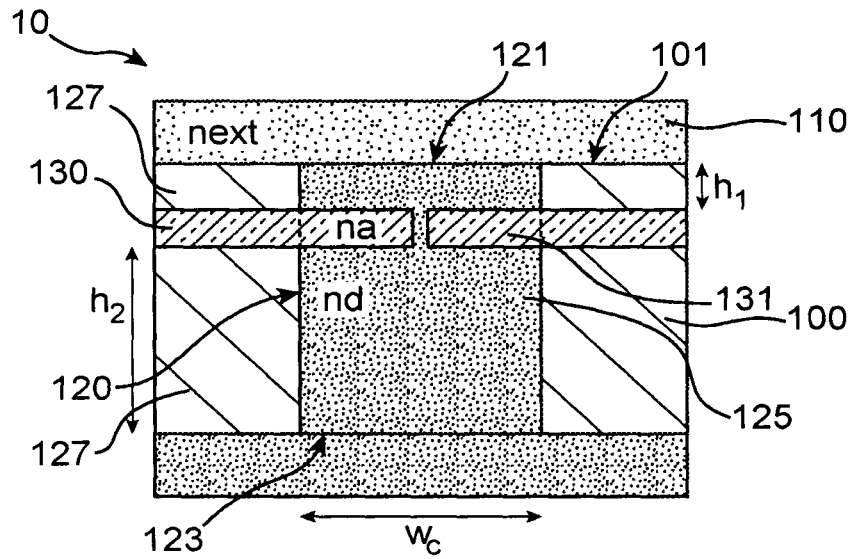
Figure 9D:
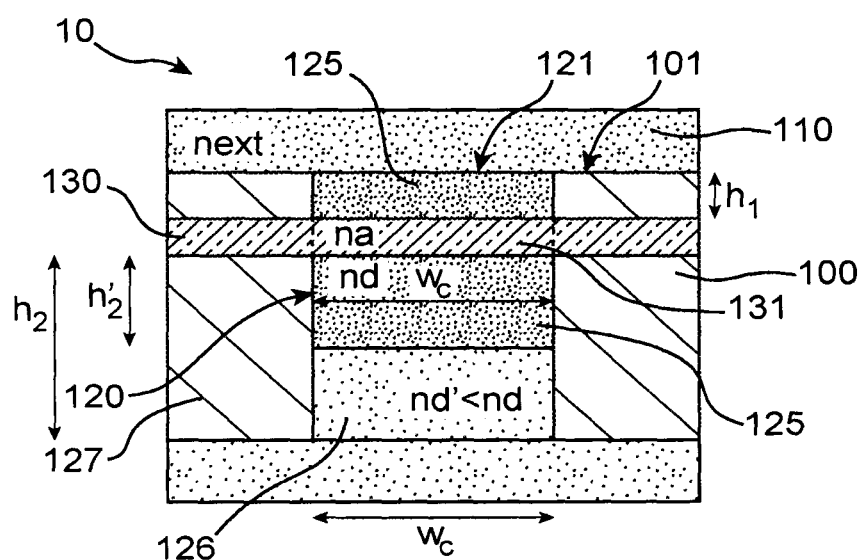
Figure 9E:
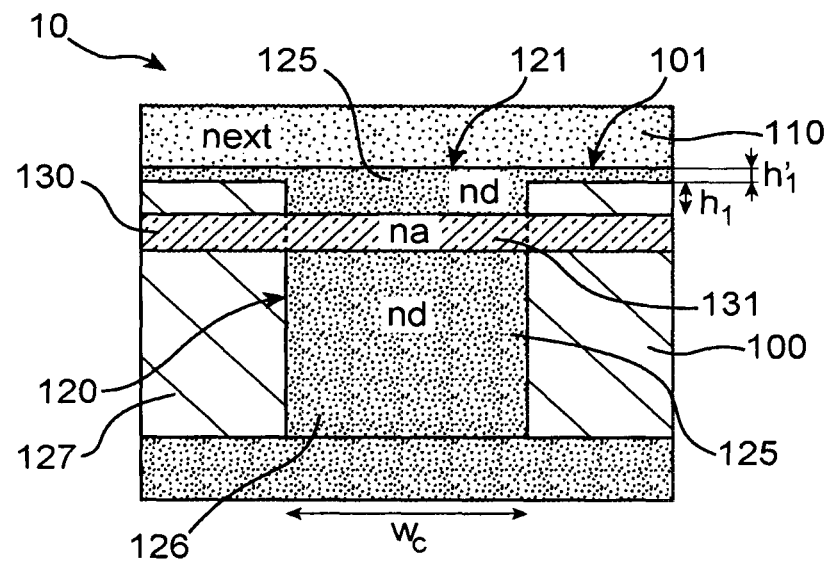
Figure 9F:
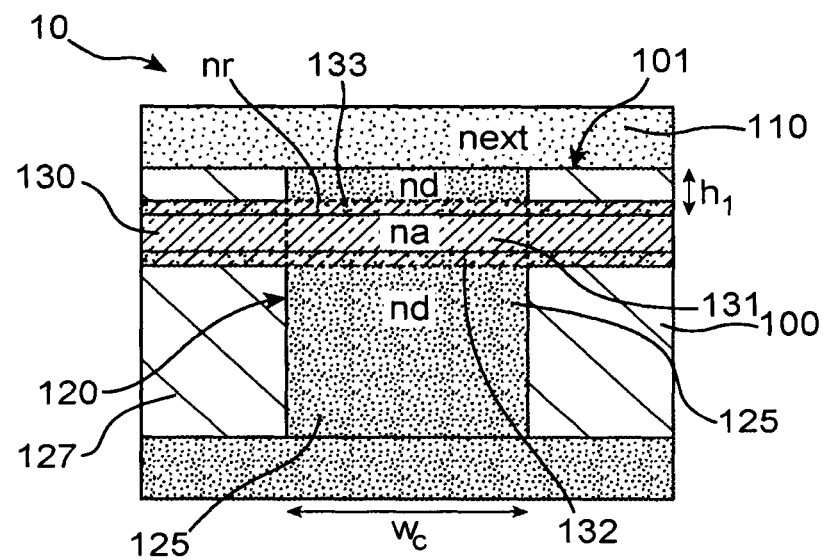
Figure 9G:
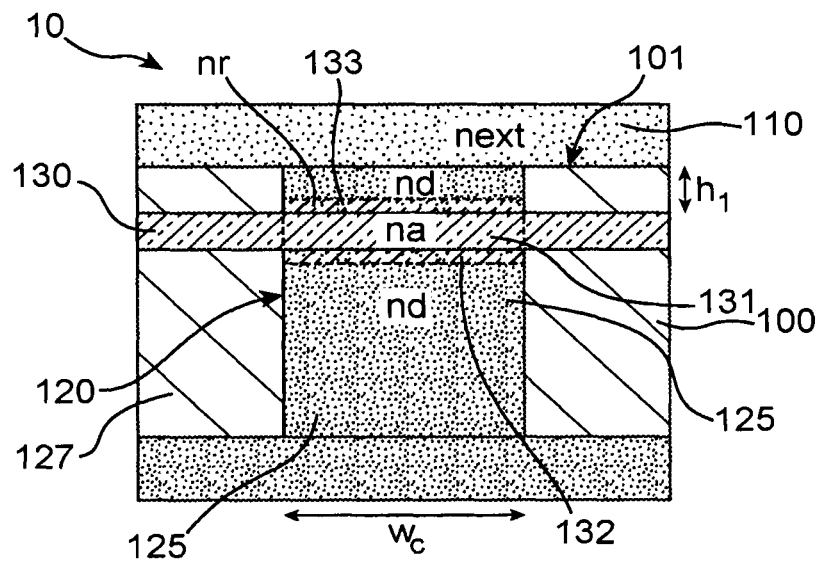
Figure 9H:
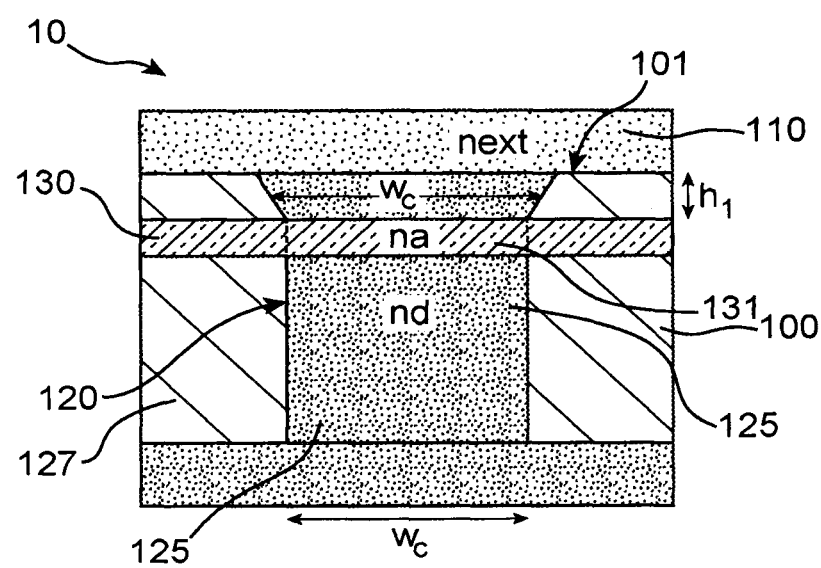

FIGS. 9A to 9H illustrate a certain number of variants of a detector structure 10 that are accessible to skilled persons under the present invention, and among which:

(i) the Fabry-Perot cavity over a first portion of thickness between the first opening and the absorption region has the Fabry-Perot cavity length Wc, and over a second portion of thickness extending beyond the absorption region 131 opposite the first opening 121 has a mean dimension Wc' of between 80% and 120% of the Fabry-Perot cavity length Wc as illustrated in FIG. 9A;

(ii) the detector structure 10 according to the first possibility of the invention has a reflective wall with at least one opening, the said opening(s) of the reflective wall having a maximum dimension equal to or less than one half of the mean confinement dimension i.e. Wc/2, as illustrated in FIG. 9B;

(iii) the detector structure 10 comprises an absorption layer 130 housing the absorption region 131, the absorption layer 130 being discontinuous in its portions outside the Fabry-Perot cavity 120, as illustrated in FIG. 9B;

(iv) the absorption region 131 has a through opening, said through opening having a maximum dimension along the layer plane of the absorption region equal to or less than Wc/4 and preferably being positioned in the centre of the Fabry-Perot cavity being filled with the first confinement medium 125, as illustrated in FIG. 9C;

(v) the confinement structure comprises a second confinement medium 126 housed in the Fabry-Perot cavity opposite the first opening 121, with the first confinement medium 125 being interposed between the absorption region 131 and said second confinement medium 126 which has a refractive index $n_{d'}$ lower than the refractive index $n_d$ of the first confinement medium, as illustrated in FIG. 9D;

(vi) the at least one first confinement medium 125 is also arranged outside the Fabry-Perot cavity 120, said first confinement medium 125 at its part outside the Fabry-Perot cavity 120 forming a coating for the conducting reflective medium 127 of thickness $h_{1'}$ less than the distance $h_1$ between the first opening 121 and the absorption region 131, as illustrated in FIG. 9E;

(vii) the absorption layer 130 has an adaptation layer 133 facing the first opening and/or the second opening (or when applicable the reflective wall), said adaptation layer 133 having a preferably variable refractive index $n_r$ the value of which remains between the refractive index $n_d$ of the at least one confinement medium 125 and the refractive index $n_a$ of the absorption layer, as illustrated in FIG. 9F;

(viii) the absorption region 131 has an adaptation layer facing the first opening and/or second opening (or when applicable the reflective wall), said adaptation layer 133 having a preferably variable refractive index $n_r$ with a value remaining between the refractive index $n_d$ of the at least one confinement medium 125 and the refractive index $n_a$ of the absorption region 131, the remainder of the absorption layer 130 being devoid of said adaptation layer as illustrated in FIG. 9G;

(ix) the Fabry-Perot cavity 120 over a first portion of its height has a variable cross-section, in the present example monotonic variation, and hence a variable Fabry-Perot cavity length, the mean Fabry-Perot cavity length according to the principle of the invention being substantially equal to $\lambda_0/(2.n_{eff})$, as illustrated in FIG. 9H.

Regarding the variant (i) illustrated in FIG. 9A, according to a preferred possibility of said variant, the central portion extends from the central region as far as the second opening 123 for a detector structure 10 according to the first possibility, or as far as the reflective wall 22 for a detector structure 10 according to the second possibility of the invention.

The principle of the invention, particularly with regard to the first and second possibilities of the invention and the different variants of configuration of the Fabry-Perot cavity 120 and absorption region 131 having been described in connection with FIGS. 2 to 9H, practical embodiments of the invention are described below.

Practical Embodiments of the Invention

First Practical Embodiment of the Invention

Figure 10A:
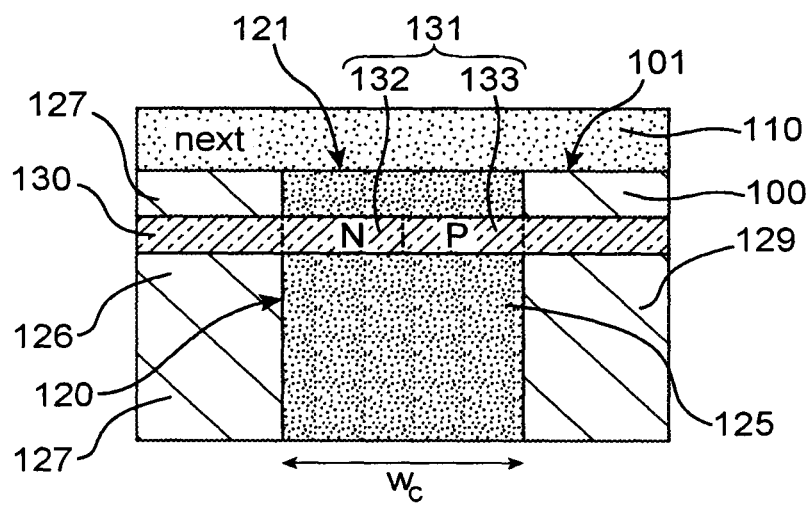
FIGS. 10A to 10B illustrate a structure according to a first practical embodiment of the invention, wherein the cavity has a square transversal cross-section, the absorption region forming a diode structure with a semiconductor junction along a diagonal of said square lateral cross-section, FIGS. 10A and 10B respectively giving a lateral cross-sectional view and a transverse cross-sectional view along a plane of the layer of said structure.
Figure 10B:
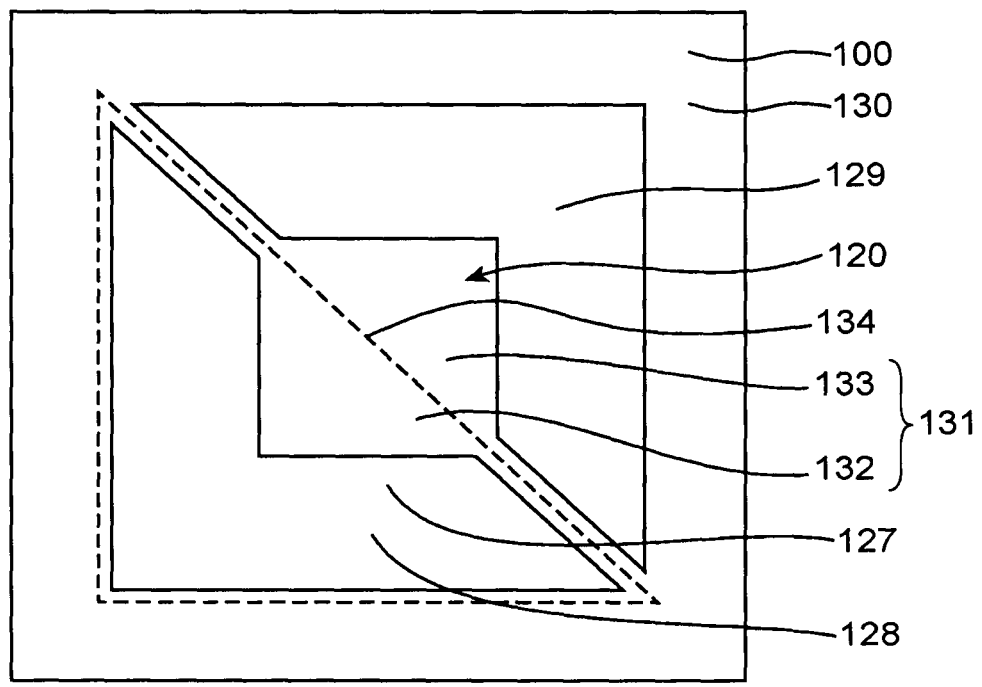

FIGS. 10A and 10B illustrate a detector structure 10 according to a first practical embodiment of the invention in which the detector structure 10 is based on a photodiode.

Said detector structure 10, as illustrated in FIG. 10A, is a detector structure according to the second possibility of the invention with a square transverse cross-section.

In this first practical embodiment of the invention, the absorption region 131 comprises a first N-doped zone 132 and a second P-doped zone 133 to form a semiconductor junction 134. Said semiconductor junction 134 extends along a diagonal of the square transverse cross-section. In this manner, the first and second zone 132, 133 each represent one half of the volume of the absorption region 131.

To allow polarisation of the first and second zones 132, 133 independently of each other, the conductive medium 127 is divided into a first contact 128 forming an N contact of the detector structure 10, and a second contact 129 forming a P contact of the detector structure 10, said first and second contacts being separated from each other by an assembly of first and second arms of the absorption layer 130.

Therefore, the absorption region 131 according to this first practical embodiment of the invention is housed in an absorption layer 130 having as shown in FIG. 10B:

the first and second arms extending beyond the absorption region 131 passing through the conducting reflective medium 137, both having an N-doped portion in contact with the first contact 128, and a P-doped potion in contact with the second contact 129; and a peripheral portion that is P-doped surrounding the conducting reflective medium 127, said peripheral portion being connected to the absorption region via the first and second arms.

To prevent short-circuiting between the first and second contacts 128, 129, the peripheral portion of the absorption layer 130 comprises a N-doped portion allowing the N contact to be isolated from the remainder of the peripheral P-doped portion.

Regarding the materials of the different elements of the invention, those skilled in the art are able to select these as a function of the targeted wavelength range on the basis of the index conditions given in the description of the principle of the invention. For example, if the wavelength band of electromagnetic radiation to be detected by the detector structure 10 is the mid-infrared band, the detector structure 10 may have the following configuration:
- an encapsulating medium in silicon oxide as incident medium, the refractive index $n_{ext}$ of said incident medium being approximately equal to 1.5;
- an operating temperature of 77 K;
- an absorption layer 130 and an absorption region 131 in cadmium mercury telluride $Cd_xHg_{1-x}Te$ with x equalling 0.29, which corresponds to a bandgap of 0.227 eV to 77K and refractive index $n_a$ of 3.45, these having a thickness $h_a$ of 150 nm;
- a Fabry-Perot cavity 120 having a confinement dimension Wc of 900 nm, with a distance $h_1$ between the first opening 121 and the absorption layer 130 including the absorption region 131 of 100 nm, and the distance $h_3$ between the absorption region 131 and the reflective wall 122 being 300 nm;
- a first conductive medium having negative permittivity 127, in gold Au;
- a confinement medium of index $n_d$ in cadmium telluride CdTe which is transparent in the infrared wavelength range and has a refractive index of 2.7.

Regarding the first and second zones 132, 133 of the absorption layer 131, these form a photodiode in the absorption layer 131. Doping of the first zone 132 is N-doping with a majority carrier concentration preferably between $10^{17}$ and $10^{18}$ cm$^{-3}$. Doping of the second zone 133 is P-doping with a majority carrier concentration preferably between $10^{16}$ and $10^{17}$ cm$^3$.

It will be noted that in the event of reverse polarisation to the one illustrated in the present practical embodiment of the invention i.e. first zone 132 having P-doping and a second having N-doping, the majority carrier concentration in the first zone 132 is preferably between $10^{17}$ and $10^{18}$ cm$^3$ and the majority carrier concentration in the second zone 13 is preferably between $10^{15}$ and $5.10^{16}$ cm$^{-3}$.

More generally, for a wavelength range of electromagnetic radiation to be detected, with respect to the material of the absorption layer and hence of the absorption region, this can be a cadmium mercury telluride $Cd_xHg_{1-x}Te$ with a cadmium concentration adapted to the selected wavelength range. For example, for structures 10 adapted to receive electromagnetic radiation in the near infrared range lower than 2 µm, the proportion of cadmium X can be higher than 0.4. For structures 10 adapted to receive electromagnetic radiation in the far infrared range in the region of 10 µm, the proportion of cadmium X can be in the region of 0.3.

It will also be noted, as a variant, that the conducting reflective medium 127 can be in silver Ag or aluminium Al.

Second Practical Embodiment of the Invention

Figure 11A:
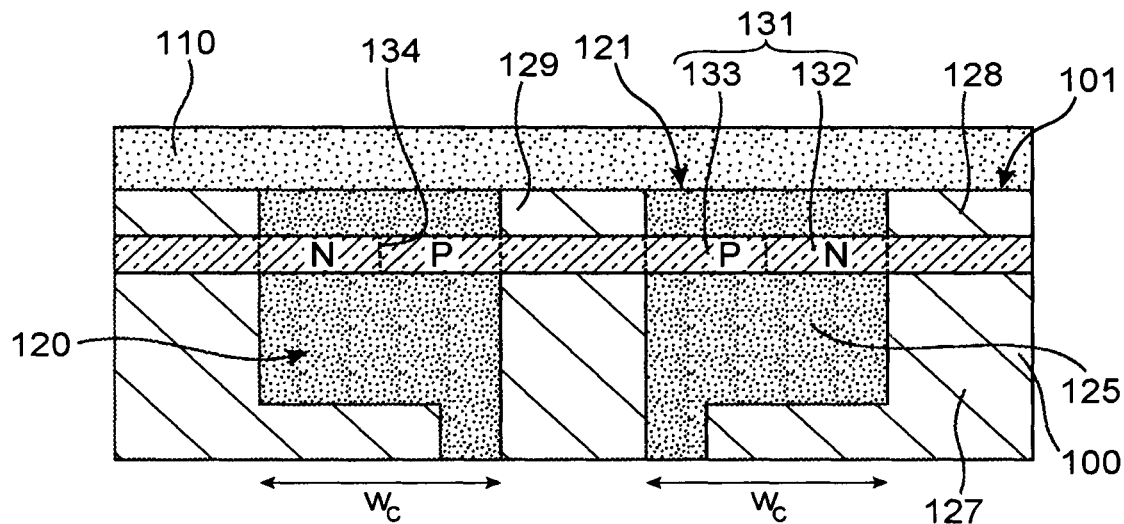
FIGS. 11A and 11B respectively illustrate a structure according to a second practical embodiment of the invention, wherein the Fabry-Perot cavity is ring-shaped, FIGS. 11A and 11B respectively giving a lateral cross-sectional view and transverse cross-sectional view along the layer plane of said structure.
Figure 11B:
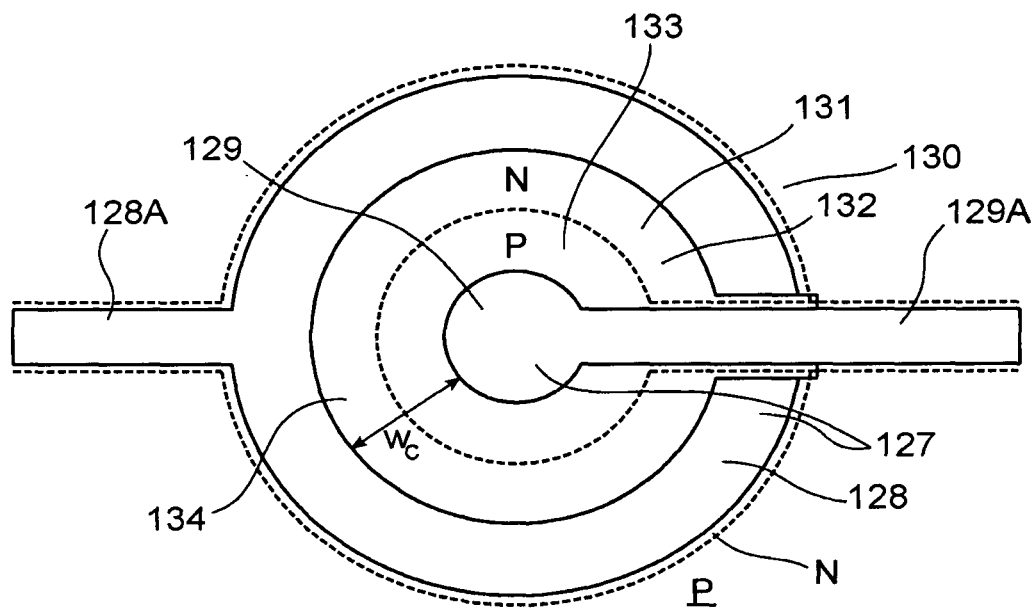

FIGS. 11A and 11B illustrate a second practical embodiment of the invention in which the Fabry-Perot cavity has a ring-shaped transverse cross-section. A detector structure according to this second practical embodiment of the invention differs from a structure according to the first practical embodiment of the invention in that:
- the Fabry-Perot cavity 120 conforms to the first possibility since the closing of this cavity is only partial, as shown in FIG. 11A;
- the Fabry-Perot cavity 120 has a ring-shaped transverse cross-section; and
- the first contact 128 and the second contact 129 are respectively a peripheral contact and a central contact of the absorption region 131.

For example, as shown in FIG. 11A, the Fabry-Perot cavity 120 has a ring-shaped transverse cross-section, the mean confinement dimension We corresponding to the difference in radii between an outer wall and the inner wall of the Fabry-Perot cavity 120. The first zone 132 of the absorption region 131 forms an outer ring-shaped half of the absorption region 131, the second zone 133 of the absorption region 131 forming an inner ring-shaped half of the absorption region 131. The semiconductor junction therefore extends along an inner circle of the Fabry-Perot cavity 131 and is in the form of an enveloping cylinder of revolution.

The conductive medium having negative permittivity 127 comprises the first contact 128 peripheral to the Fabry-Perot cavity 120, and the second contact 129 central to the Fabry-Perot cavity. The first contact as illustrated in FIG. 11B, comprises an opening to allow the passing of a second connecting via 129A of the second contact 129. It will be noted that the first contact also comprises a first connecting via 128A of the first contact 128.

Along a principle similar to the first practical embodiment of the invention, in the opening of the first contact 128, the absorption layer 120 has an N-doped portion along the first contact, and a P-doped portion along the connecting via 129A of the second contact 129.

In similar manner, the peripheral portion of the absorption layer 130 comprises an N-doped portion allowing the first contact 128 which is an N contact to be isolated from the remainder of the peripheral P-doped portion.

Figure 12A:
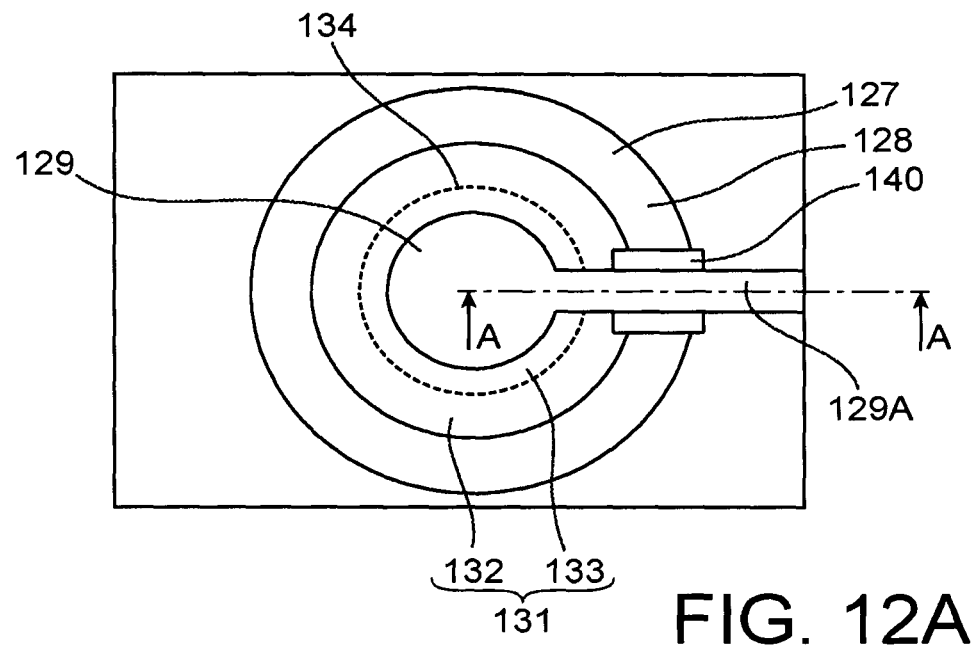
FIGS. 12A and 12B illustrate the practical arrangement of a structure according to the second embodiment illustrated in FIGS. 11A and 11B, FIGS. 12A and 12B respectively giving an overhead view and a lateral cross-sectional view of said structure.
Figure 12B:
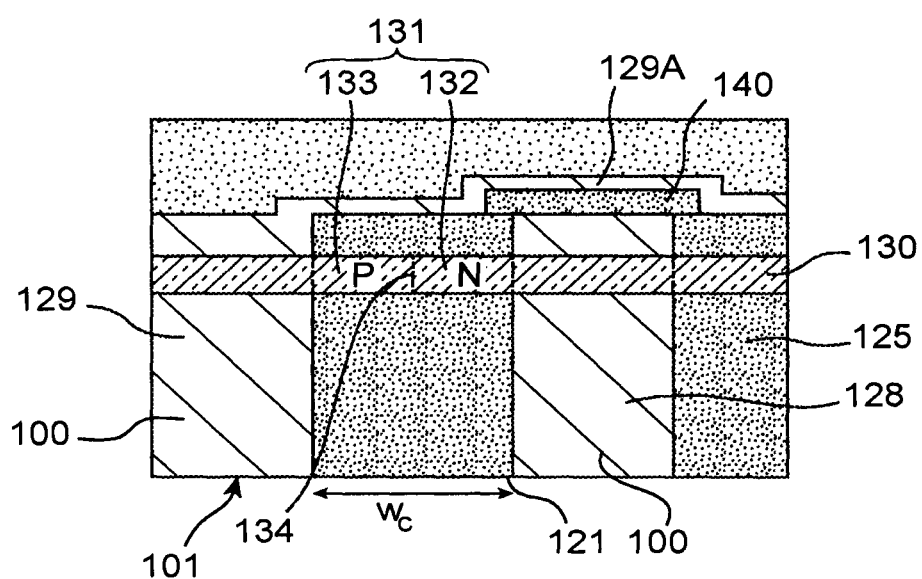

FIGS. 12A and 12B illustrate a variant of this second practical embodiment of the invention, in which:
- the first and second zones 132, 133 of the absorption 131 have reverse doping;
- the connecting via 129A of the second contact 129 is located solely on an upper portion of the Fabry-Perot cavity 120, said connecting via 129A being isolated from the first zone by means of an insulating layer 140.

Therefore, as shown in FIGS. 12A and 12B, the first contact 128 is isolated from the connecting via 129A by the insulating layer 140 and is arranged in contact with the confinement medium 125 which is also a dielectric medium. In this manner, there is no need to make provision for a P-doped zone around the connecting via 129A, said connecting via 129A being solely arranged in contact with electrically insulating materials, the confinement medium 125 and the insulating layer 140.

Third Practical Embodiment of the Invention

Figure 13:
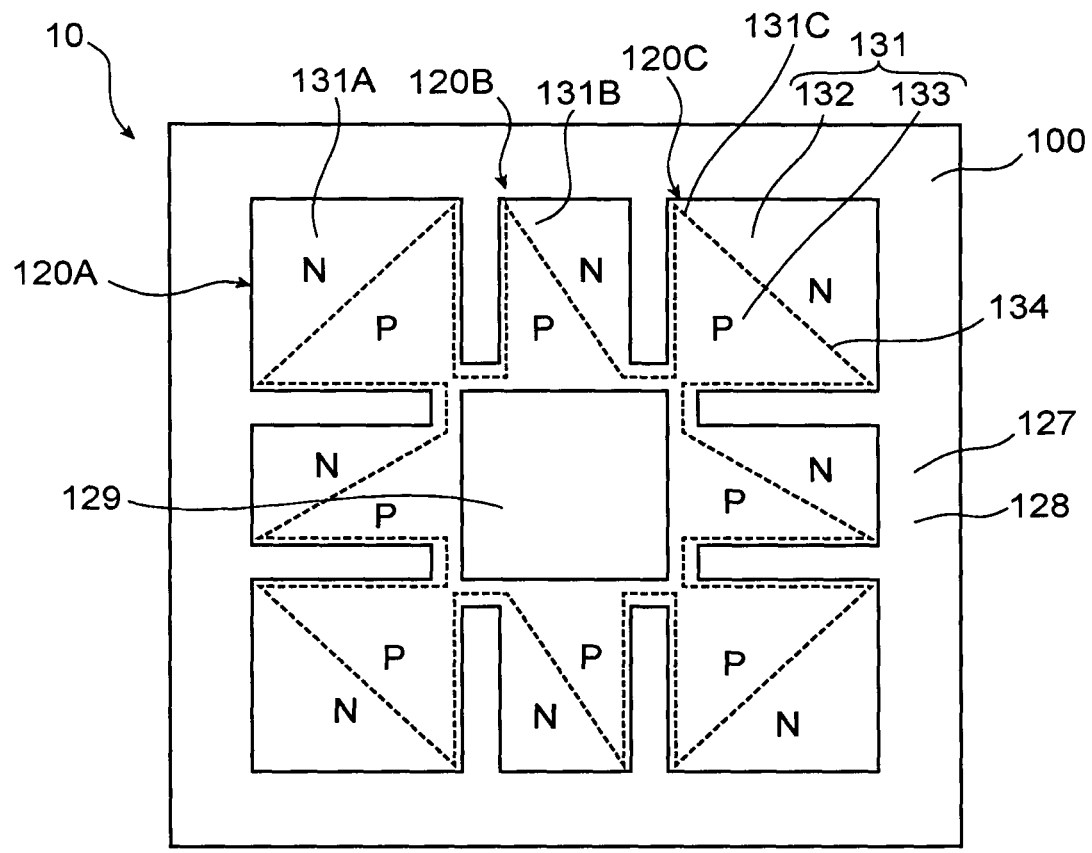
FIG. 13 schematically illustrates a transverse cross-sectional view along the layer plane of a structure according to a third practical embodiment of the invention, wherein the structure has a central contact and eight Fabry-Perot cavities arranged around said central contact.

FIG. 13 illustrates a structure according to a third practical embodiment of the invention in which the detector structure 10 comprises a plurality of Fabry-Perot cavities 120 connected in parallel, to optimise the efficacy of the detector structure 10. Said detector structure 10 according to the third practical embodiment of the invention differs from a detector structure 10 according to the first practical embodiment of the invention in that the detector structure 10 comprises a plurality of Fabry-Perot cavities 120A, 120B, 120C and hence of absorption regions 131A, 131B, 131C, and in that it comprises a first peripheral contact 128 and a second central contact 129 forming the conducting reflective medium 127.

Therefore, as shown in FIG. 13, the structure 10 comprises eight Fabry-Perot cavities 120A, 120B, 120C, four side Fabry-Perot cavities 120B facing a side of the second central contact 128 of square cross-section, and four angle cavities 120A, 120C corresponding with an angle of the second central contact 129. Each Fabry-Perot cavity has a square transverse cross-section.

In each Fabry-Perot cavity 120A, 120B, 120C, in a configuration similar to the one in the first practical embodiment of the invention, the first zone 132 represents one half of the absorption region and the second zone 133 represents the other half of the absorption region with the semiconductor junction extending along a diagonally across said Fabry-Perot cavity.

With said configuration, it is possible to benefit from the absorption afforded by the eight Fabry-Perot cavities 120A, 120B, 120C whilst paying heed to size restrictions of the cavity of the invention.

Fourth Practical Embodiment of the Invention

Figure 14A:
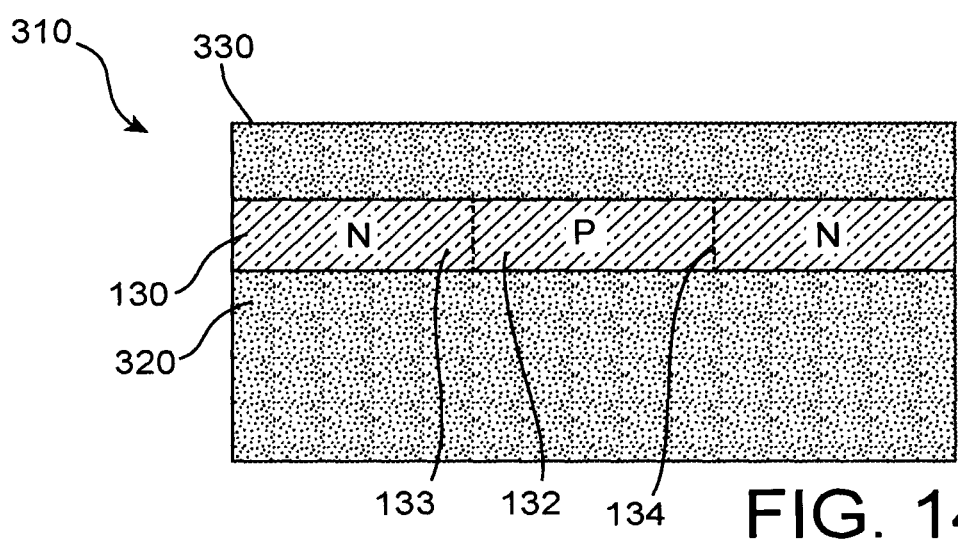
FIGS. 14A to 14E illustrate the main steps of a method to manufacture a structure according to a fourth practical embodiment of the invention, wherein the structure has a ring-shaped conformation similar to that of the structure in the second practical embodiment and wherein the structure is associated with a control support via indium bead hybridization, FIGS. 14A, 14D and 14E each giving a lateral cross-sectional view and FIGS. 14B et 14C both giving a lateral cross-sectional view and an overhead view.
Figure 14B:
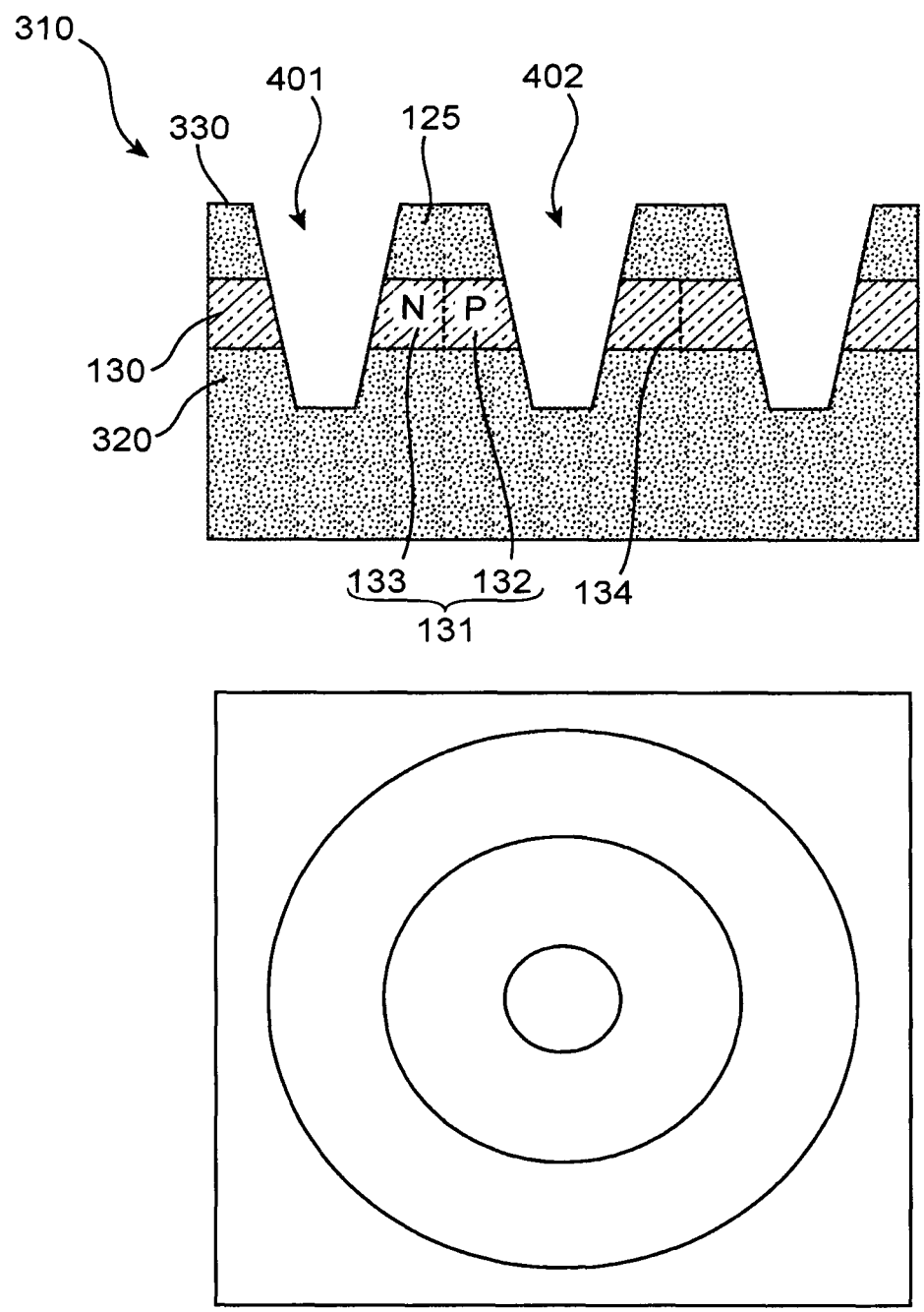
Figure 14C:
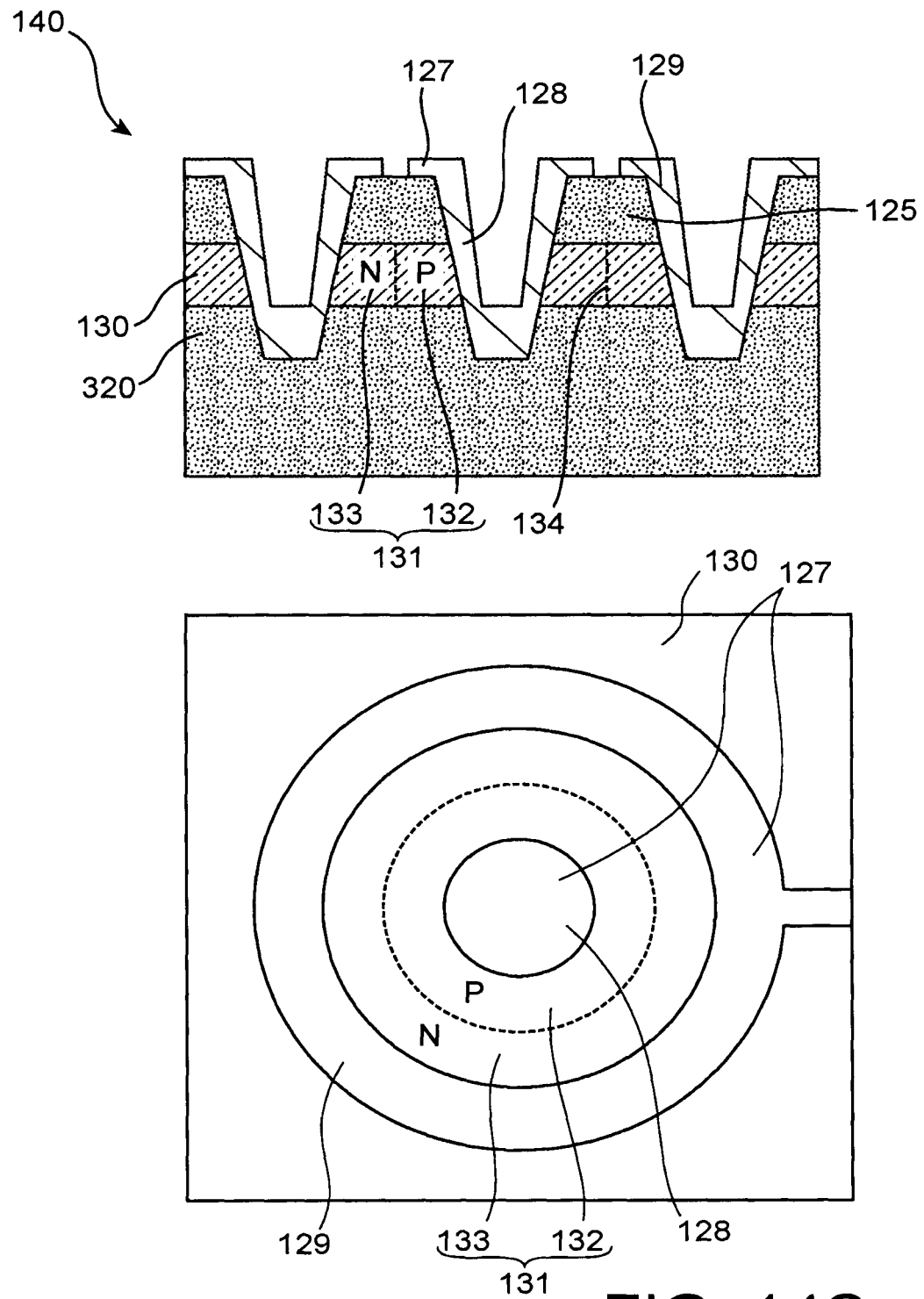
Figure 14D:
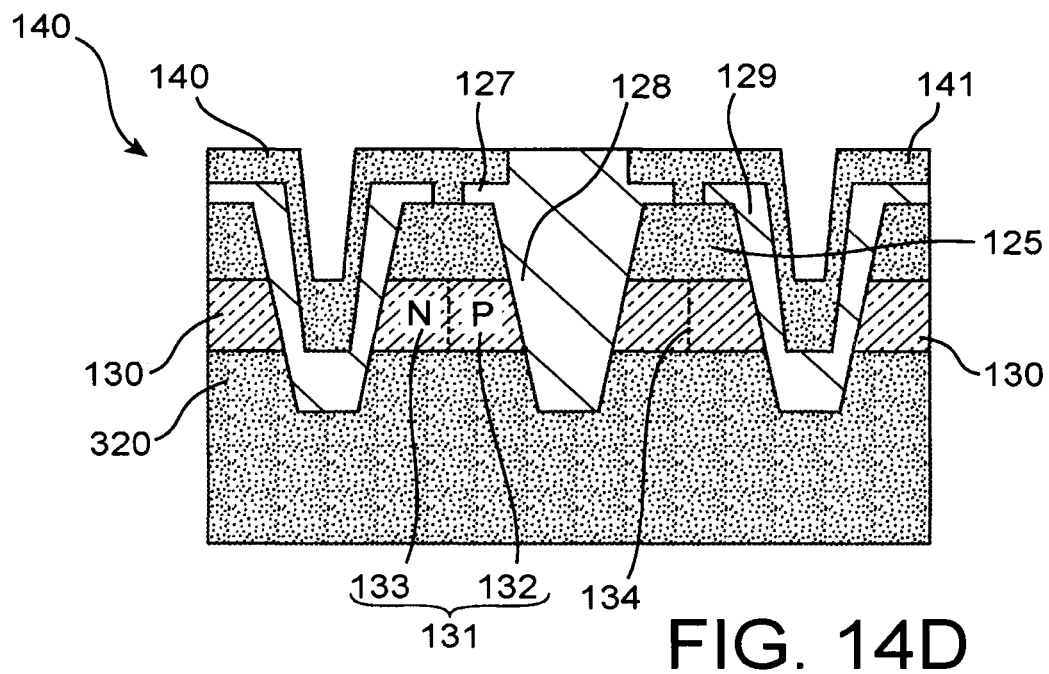
Figure 14E:
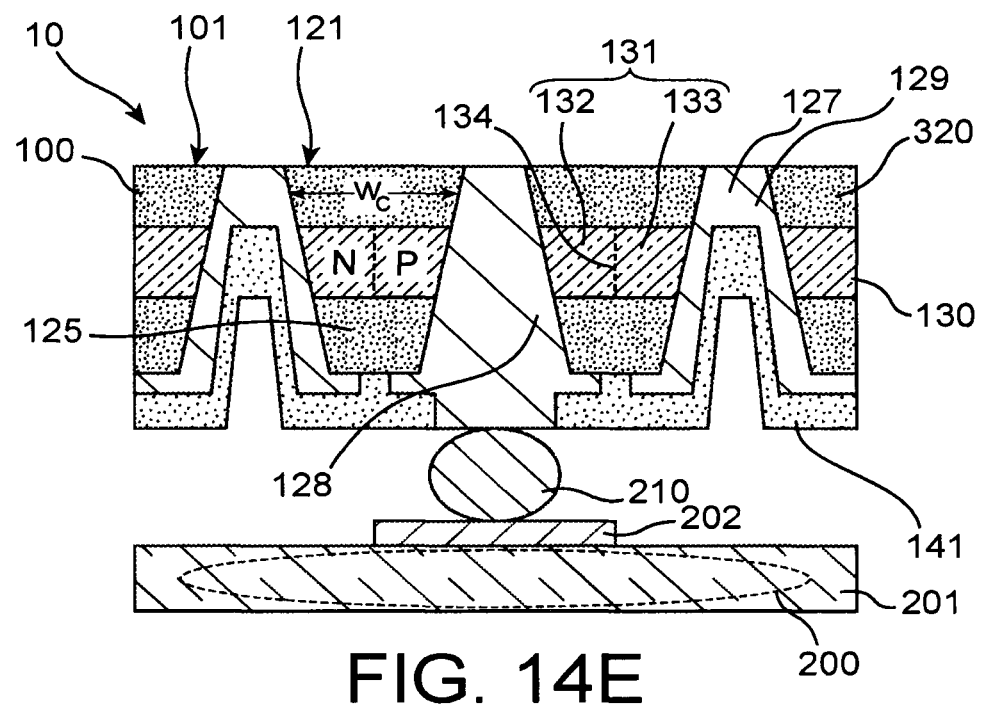

FIGS. 14A to 14E illustrate a method for manufacturing a detector structure 10 according to a fourth practical embodiment of the invention, said method allowing the association of said detector structure with a control circuit 200 provided on a second support 201. Said detector structure 10 differs from a detector structure 10 of the second practical embodiment of the invention, as shown in FIG. 14E, in that:
- the first zone 132 and the second zone 133 are of reverse configuration, the first zone 132 corresponding to the inner zone of the absorption region 131, the second zone 133 corresponding to the outer zone of the absorption region 131;
- the Fabry-Perot cavity 120 has a variable Fabry-Perot cavity length We along its height, the walls of the Fabry-Perot 120 cavity being sloped;
- the second contact 129, which is the peripheral contact of the absorption region 131, is closed and does not comprise an opening for passing of a connecting via 210;
- the first central contact 128 is adapted to be connected via indium bump hybridization 210 to the control circuit 200.

Therefore, the absorption region 131 in addition to the reverse configuration of the first and second zones 132, 133 and the fact that the Fabry-Perot cavity is devoid of connecting via for the central contact, here has a first contact 128 of similar configuration to that of the detector structure 10 according to the second practical embodiment of the invention.

The method for manufacturing said detector structure 10 comprises the following steps:
- providing a first support 310 comprising a substrate 320, an absorption layer 130, said absorption layer 130 comprising a first P-doped zone 132 and a second N-doped zone 133, to form the absorption region 130, a passivation layer 330, the substrate 320 and the passivation layer 330 being intended to form the confinement medium 125, and the second zone 133 surrounding the first zone 132, as illustrated in FIG. 14A;
- partial, localised etching of the first support 310 to form the imprint of the first and second contacts 128, 129 in the passivation layer 330, the adsorption layer 130 and the substrate 320, said etching allowing the forming of central penetration 402 corresponding to the second contact 129, and an annular penetration 401 surrounding the central penetration corresponding to the first contact 128, said partial and localised etching being centred around the first zone 132 so as to position the semiconductor junction 134 between said first and second penetrations 401, 402, as illustrated in FIG. 14B;
- localised depositing of a layer of conducting reflective material in contact with the walls of the central penetration and annular penetration, the conducting reflective material deposited in contact with the walls of the central penetration forming the first contact 128 and the conducting reflective material deposited in contact with the walls of the peripheral penetration forming the second contact 129, said conducting reflective material forming the conducting reflective medium 125, the first and second contacts being spaced apart as illustrated in FIG. 14C;
- depositing insulating material 140 on the surface of the first support 310 other than on the first contact 128;
- filling the remainder of the central penetration with the conducting reflective material 127 so that the first contact 128 is able to allow connection via indium bump hybridization 210, as illustrated in FIG. 14D;
- thinning the substrate 320 to provide a configuration conforming to the variant in FIG. 9E, i.e. the remaining thickness of the support 320 outside the Fabry-Perot cavity 120 has a thickness $h_1$, less than the distance h1 between the absorption region 131 and the first opening 121, as illustrated in FIG. 14E.

Figure 15:
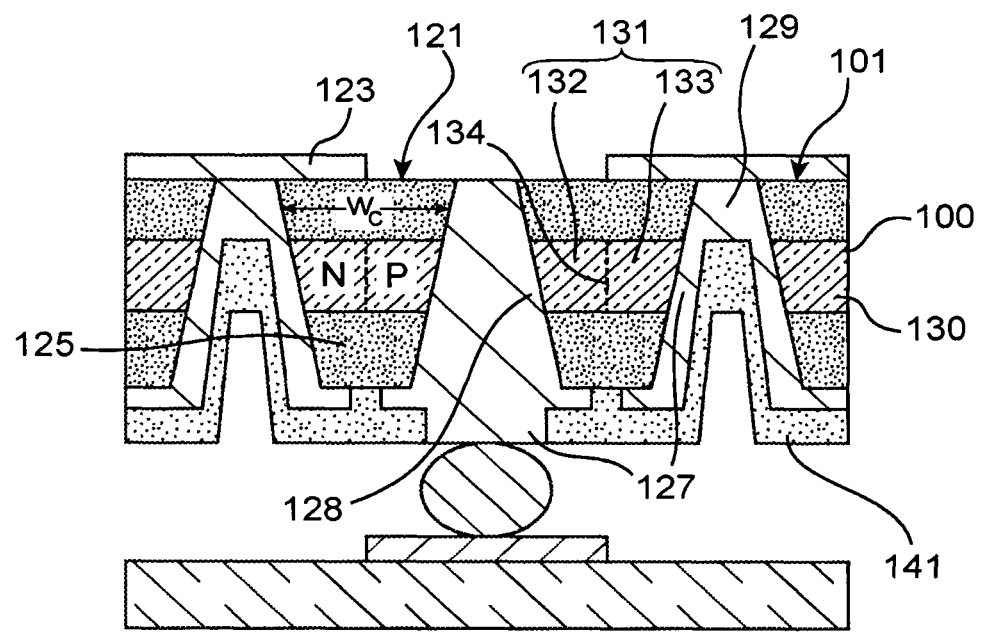
FIG. 15 illustrates a variant of the structure according to the fourth embodiment wherein there are provided four lateral extensions on a receiving surface of the structure to limit possible undesired electromagnetic modes for said structure, FIG. 15 showing a lateral cross-sectional view and an overhead view of said structure.
Figure 15:
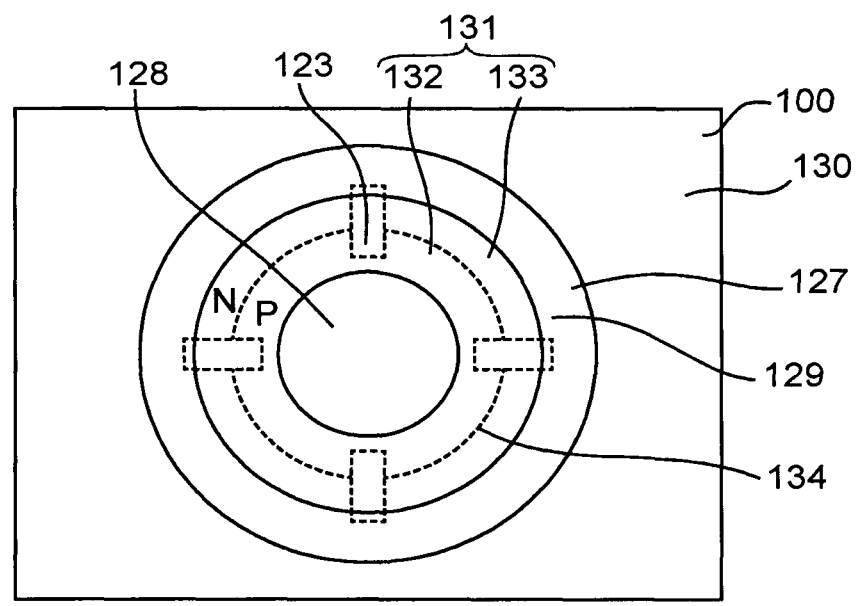

FIG. 15 illustrates a detector structure 10 according to a variant of a detector structure 10 in this third practical embodiment of the invention, which differs in that the substrate 320 has been thinned to release the first opening 121 and in that lateral extensions 123 are provided of the second contact 129 at the first opening 121 to limit electromagnetic modes which might cause interference of the Fabry-Perot cavity mode if polarisation of incident light is poorly oriented in relation to the opening of the ring-shaped resonator.

Such lateral extensions 123, as illustrated on the right side in FIG. 15, may be in the form of four portions of a layer of conducting reflective material distributed over the periphery of the second contact 129.

Therefore, the method for manufacturing a detector structure 10 according to this variant of the third practical embodiment of the invention differs from a method for manufacturing a detector structure of the third practical embodiment of the invention in that:
- at the thinning step of the substrate 320, thinning of the substrate 320 is halted when the first opening 121 lies flush with the surface of the substrate 320, and
- there is also provided a step for the localised deposit of conducting reflective material to form the lateral extensions 123 of the second contact 129.

Fifth Practical Embodiment of the Invention

FIGS. 16A to 16D illustrate the steps of a method for manufacturing a detector structure according to a fifth practical embodiment of the invention in which the absorption layer 130 is continuous and is therefore not pierced when forming said detector structure 10. A detector structure 10 according to this fifth embodiment differs from a detector structure 10 according to the first practical embodiment of the invention in that the Fabry-Perot 120 cavity has a variable confinement dimension along its height, the walls of the Fabry-Perot cavity 120 being sloped.

Figure 16A:
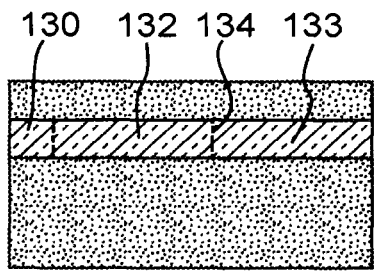
FIGS. 16A to 16D give lateral cross-sectional views illustrating the main steps to manufacture a structure according to a fifth practical embodiment of the invention wherein the method is implemented without requiring through etching of the absorption layer.
Figure 16B:
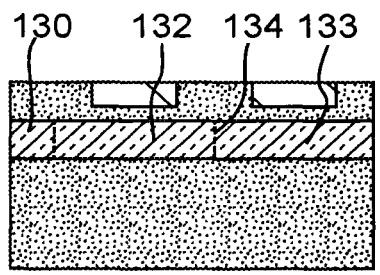
Figure 16C:
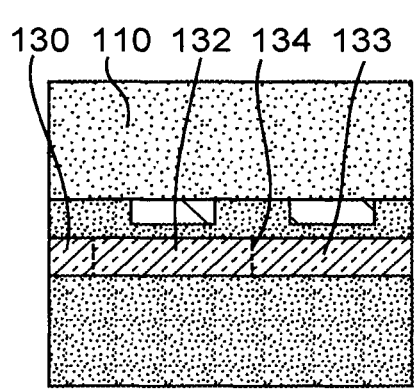
Figure 16D:
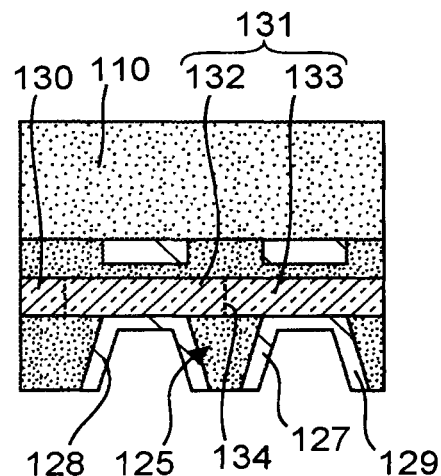

A method to manufacture a detector structure 10 according to this fifth embodiment comprises the following steps:
- providing a first support 310 comprising a substrate 320, an absorption layer 130, said absorption layer 130 comprising a first P-doped zone 132 and a second N-doped zone 133, a passivation layer 330, the substrate 320 and the passivation layer 330 being intended to form the confinement medium 125 as illustrated in FIG. 16A;

partial etching of the passivation layer to form a first and second penetration respectively corresponding to the first and second contacts 128, 129, and surrounding the semiconductor junction 134 between the first and second zones 132, 133;

depositing a conducting reflective material to fill the first and second penetrations, as illustrated in FIG. 16B;

bonding a layer of insulating material in contact with the passivation layer 330 to form the incident medium 110, as illustrated in FIG. 16C;

partial, localised etching of the first support 310 so as to form in the substrate 320 the imprint of the first and second contacts 128, 129 in addition to the parts already formed in the passivation layer 330, said etching allowing the formation of a third penetration corresponding to the first contact 128, and a fourth penetration corresponding to the second contact 129, both penetrations entering at least in part into zones 132 et 133 respectively;

localised depositing of a layer of conducting reflective material in contact with the walls of the third penetration and fourth contact, the conducting reflective material deposited in contact with the walls of the central penetration forming the first contact 128, and the conducting reflective material deposited in contact with the walls of the peripheral penetration forming the second contact 129, said conducting reflective material forming the conducting reflective medium 127, the first and second contacts being spaced apart as illustrated in FIG. 16D.

Sixth Practical Embodiment of the Invention

FIGS. 17A to 17D illustrate a detector structure 10 according to a sixth practical embodiment of the invention wherein the detector structure 10 is bonded to a second support 210 for connection thereof to a control circuit 200 of said second support 201.

It will be noted that in this sixth embodiment, the detector structure 10 conforms to the first possibility of the invention with the Fabry-Perot cavity partly closed by contact pads 210 of the second support 201, said contact pads forming the reflective wall 122. Although FIGS. 17A to 17D only show a lateral cross-section of the detector structure, the Fabry-Perot cavity may have a square transverse cross-section, said cavity having an opening to allow polarisation of the second zone 133 by means of the second contact 123 which is a common contact. Each isolated pad 127 is surrounded by a zone 132 having a first doping type, two adjacent zones 132 being entirely separated by a zone 133 of other doping type. However, the zones 133 together form a region which is contiguous and electrically connected (continuous and of same doping type) and are in direct common contact with a side pad 123.

Figure 17A:
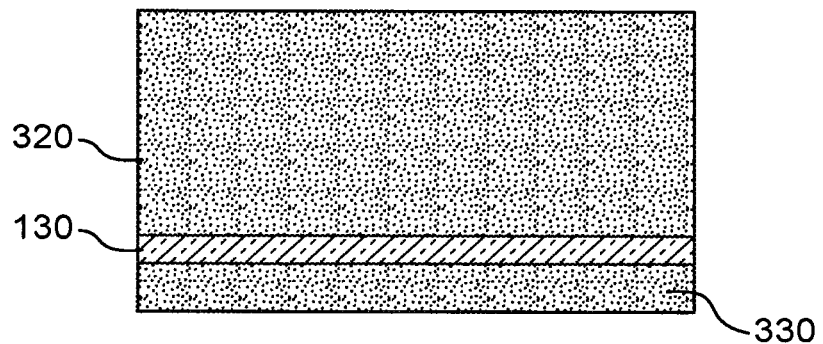
FIGS. 17A to 17D illustrate lateral cross-sectional views of the main steps to manufacture a structure according to a sixth embodiment wherein the structure is associated with a control support via bonding onto said support.
Figure 17B:
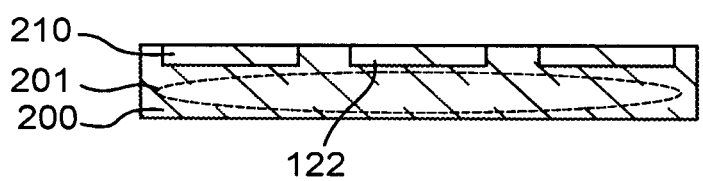
Figure 17C:
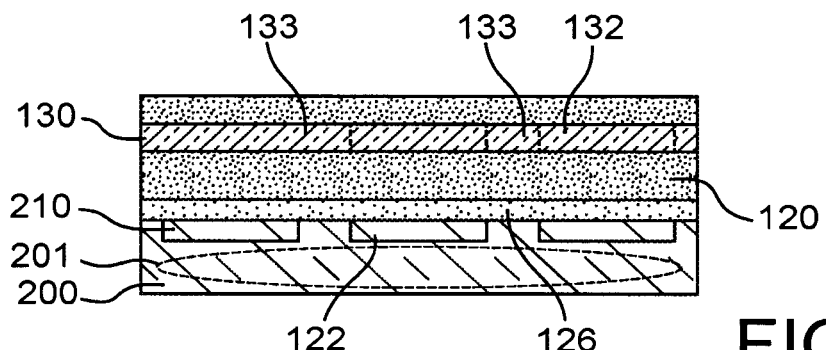
Figure 17D:
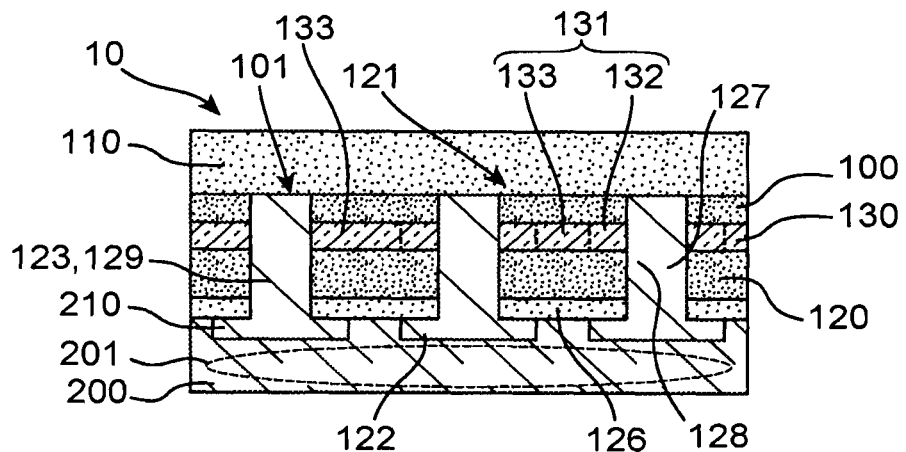

A method to manufacture a detector structure 10 according to this fourth embodiment comprises the following steps:

providing a first support 310 comprising a substrate 320, an absorption layer 130, said absorption layer 130 being P-doped, the substrate 320 and the passivation layer 330 being intended to form the confinement medium 125;

providing a second support 200, said second support 200 comprising a control circuit 200 of the detector structure and contact pads 210 configured to be connected to contacts of the detector structure 10 and to form a reflective wall 122 of the invention, as illustrated in FIG. 17A, bonding the first support 310 to the second support with the passivation layer 330 in contact with the surface of the second support 201 comprising the contact pads 210, said bonding being performed with a material able to form a second confinement medium 126, conforming to the variant (v) of the invention, said material able to form the second confinement medium 126 can be a non-conducting epoxy resin for example;

thinning the substrate 320, as illustrated in FIG. 17B;

doping the absorption layer 130 by implanting a doping element able to provide electrons as majority carriers, to allow the formation of the first zone 133 and to delimit the second zone 132;

localised etching of the substrate 320, of the absorption layer 130, the passivation layer 330 and of the material able to form the second confinement medium 126, to form the imprints of the first and second contacts, said imprints opening onto the contact pads 210 of the second support 201, as illustrated in FIG. 17C, filling the imprints with the conducting reflective material 127 to form the first and second contacts 122, 123, as illustrated in FIG. 17D.

Possible Association of Several Detector Structures of the Invention

Figure 18A:
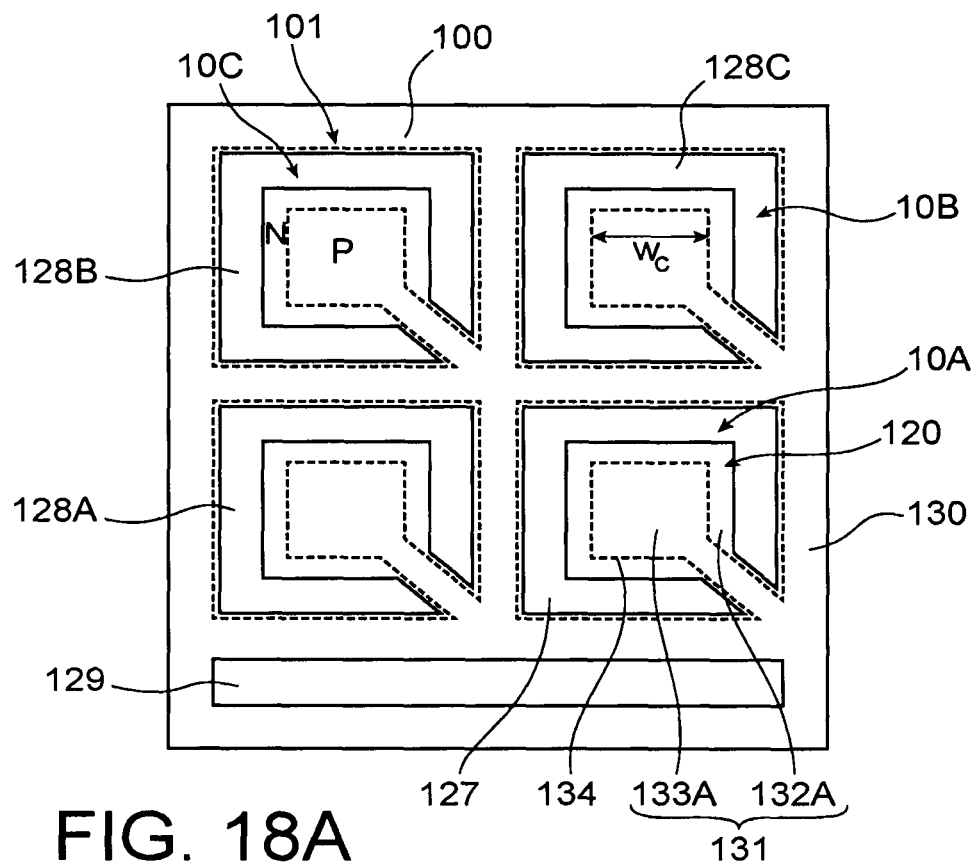
FIGS. 18A to 18C illustrates overhead views of examples of embodiment of the invention allowing optimized periodical arrangement of structures according to the invention.
Figure 18B:
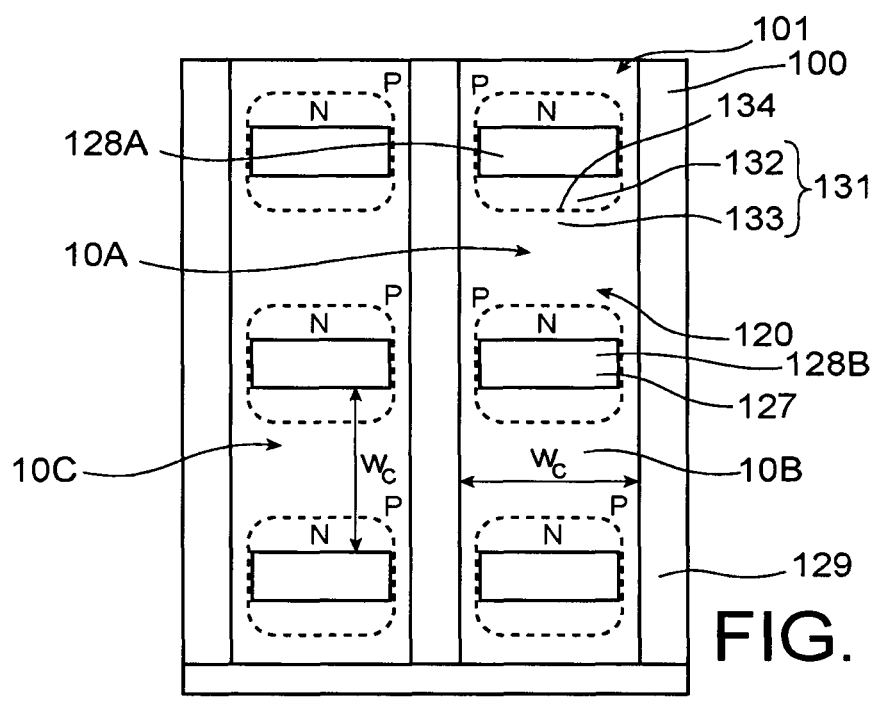
Figure 18C:
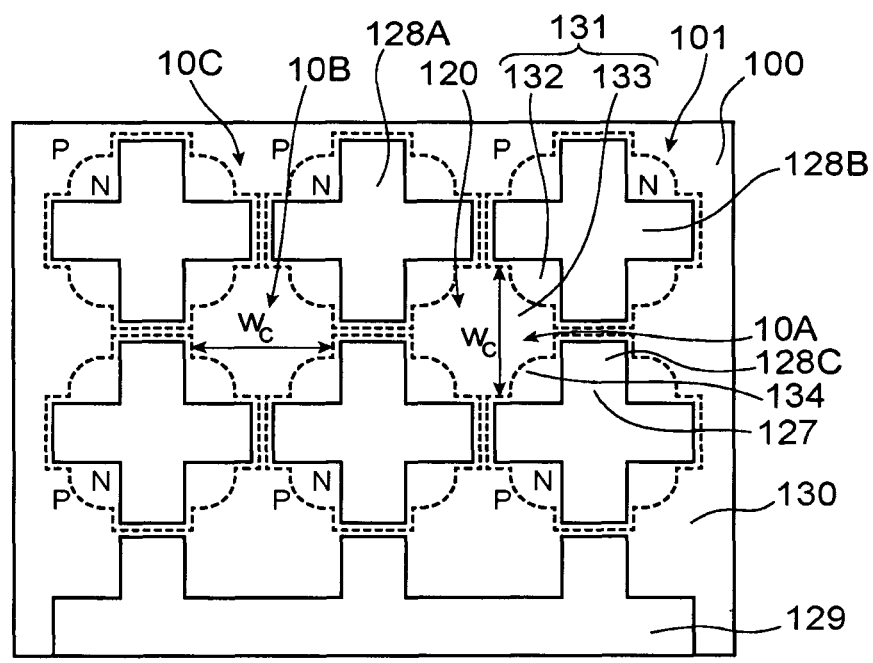

FIGS. 18A to 18C show different arrangements of detector structures according to the invention, to provide an electronic radiation detection device 1 comprising a plurality of said detector structures 10A, 10B, 10C in association. Said detection devices as illustrated in FIG. 18A comprise a plurality of detector structures 10A, 10B, 10C each having a Fabry-Perot cavity 120, an absorption region 131, a first individual contact 128A, 128B, 128C, the detection device also comprising a second common contact 129.

According to the first possible arrangement of said device 1 illustrated in FIG. 18A, the Fabry-Perot cavity 120 of each detector structure 10A, 10B, 10C has a square transverse cross-section, the first zone 132 being a peripheral zone of the absorption region 131 and the second zone 133 being central with a semiconductor junction 134 of square transverse cross-section. According to this same possibility, the conducting reflective medium is formed by the first contact 128A, 128B, 128C. The first contact 128A, 128B, 128C of each detector structure 10A, 10B, 10C has an opening to allow polarisation of the second zone 133. The absorption layer 130 is also provided with the second common contact 129. In this manner, it is possible with said arrangement to polarise each detector structure individually, and hence to detect the individual operating current of said detector structure 10 whilst affording a compact arrangement.

According to the second possible arrangement of said device 1 illustrated in FIG. 18B, the first contacts 128A, 128B have a rectangular transverse cross-section delimiting each of the Fabry-Perot cavities on either side, each Fabry-Perot cavity also being laterally delimited by two extensions of the second contact 129. For each of the detector structures 10A, 10B, 10C, the first zone 132 surrounds the first contacts 128A, 128B delimiting the Fabry-Perot cavity 120, the remainder of the absorption region forming the second zone 133 of said detector structure 10A, 10B, 10C.

According to the third possible arrangement of said device 1 illustrated in FIG. 18C, each of the Fabry-Perot cavities 120 is delimited by four first contacts 128A, 128B, 128C so that they have a square transverse cross-section. Each first contact 128A, 128B, 128C has a cross-shaped transverse cross-section, the arms of said first contacts 128A, 128B, 128C forming the walls of the Fabry-Perot cavity 120. The first zone 132 of each absorption region 131 surrounds said first contacts 128A, 128B, 128C.

Evidently, in conformity with the knowledge persons skilled in the art, while in the practical embodiments of the invention described herein the first zone 132 of the absorption region 131 is of particular doping and the second zone 133 of the absorption region has opposite doping, it can also be envisaged without departing from the scope of the invention to reverse the different doping types of the structure according to each of said practical embodiments of the invention. In other words, and in general, in each of said practical embodiments of the invention, the first zone 132 of the absorption region 131 has a first type of conductivity selected from among the type of conductivity in which the electrons are majority carriers and the type of conductivity in which the holes are the majority carriers, the second zone 133 of the absorption region 131 having a second type of conductivity opposite the first type to conductivity.

It will also be noted, according to one advantageous possibility of the invention, as already described, that a detector structure 10 of the invention can be equipped with an optical device to concentrate electromagnetic radiation, such as a lens or mirror, configured to concentrate part of electromagnetic radiation onto the first opening 121 of the Fabry-Perot cavity of the detector structure 10. It will be noted that said function of the optical concentration device can optionally be provided via conformation of the incident medium, the latter possibly having a lens or pluri-lens profile of convex shape on the surface exposed to incident light.

Evidently, all the practical embodiments of the invention are given by way of example to implement the invention, and it is within the reach of skilled persons to adapt these as a function of needs, in particular to optimise functioning thereof at a first particular wavelength range, without departing from the scope of the invention. In particular, the semiconductor forms described in connection with these different practical embodiments are in no way limiting and can easily be modified by a skilled person. Along this same principle, while in the present practical embodiments of the invention the absorption region 131 is of photodiode type having a first and second zone 132, 133 of opposite doping, the diode junctions can be omitted and in this case the detector is given more use as photo-conductor, i.e. based on the passing of current between contacts via purely photo-resistive effect through the semiconductor, as in bolometers.

It is to be noted that all the diode structures 10 described in the foregoing are used as detector (absorber) of electromagnetic radiation in the invention, but reciprocally they could be just as well employed as radiation emitters by injecting current into the diode junctions.

The invention claimed is:

1. Electromagnetic radiation detector structure adapted to detect electromagnetic radiation in at least one first given range of wavelengths centred around a first wavelength $\lambda_0$, the detector structure comprising:
   - a support having a receiving surface arranged to receive at least part of the electromagnetic radiation and at least one conductive medium having negative permittivity,
   - a Fabry-Perot cavity arranged in the support and extending at least in part along a thickness of the support, said Fabry-Perot cavity leading onto a first opening of the receiving surface and being delimited by the at least one conductive medium having negative permittivity, the Fabry-Perot cavity having on at least one first portion of thickness of the support including the receiving surface a mean Fabry-Perot cavity length Wc in at least one direction parallel to the receiving surface, the Fabry-Perot cavity housing at least one first confinement medium of refractive index $n_d$;
   - an absorption region, configured to absorb electromagnetic radiation, the absorption region having a refractive index $n_a$,
   - wherein the mean Fabry-Perot cavity length Wc is equal to $\lambda_0/(2.n_{eff})$, with $n_{eff}$ being an effective refractive index of a guided mode in the absorption region (131) at the first wavelength $\lambda_0$;
   - wherein the absorption region has a thickness $h_a$ of less than $\lambda_0/(5.n_a)$;
   - wherein the absorption region is housed in the Fabry-Perot cavity at a distance $h_1$ from the first opening of said Fabry-Perot cavity of between $\lambda_0/(50.n_d)$ and $\lambda_0/(4.n_d)$;
   - wherein the thickness of the at least one first portion is equal to or greater than $h_1$; and
   - wherein the refractive index $n_d$ of the at least one first confinement medium being lower than 80% of the refractive index $n_a$ of the absorption region.

2. The detector structure according to claim 1, wherein the Fabry-Perot cavity on a second portion of the thickness of the support has at least one dimension in at least one direction substantially parallel to the receiving surface of between 80% and 120% the mean Fabry-Perot cavity length Wc.

3. The detector structure according to claim 1, wherein the absorption region is arranged in an absorption layer, said absorption layer extending outside the Fabry-Perot cavity in a plane parallel to the receiving surface.

4. The detector structure according to claim 1, wherein the Fabry-Perot cavity, opposite the first opening, is at least partly closed by a reflective wall configured to reflect the electromagnetic radiation, said reflective wall being arranged at a distance $h_3$ from the absorption region of between $\lambda_0/(10.n_d)$ and $\lambda_0/(2.n_d)$, with $n_d$ being the refractive index of the first confinement medium, said distance $h_3$ between the reflective wall.

5. The detector structure according to claim 1, wherein the Fabry-Perot cavity has a second opening opposite the first opening, the distance $h_2$ between said second opening and the absorption region being greater than $\lambda_0/(2.n_d)$.

6. The detector structure according to claim 1, wherein the detector structure comprises a least one adaptation layer of refractive index $n_r$ arranged between the absorption region and the confinement medium, the refractive index of said adaptation layer having a value which is included between the refractive index $n_d$ of the at least one confinement medium and the refractive index $n_a$ of the absorption layer, the refractive index $n_a$ value of the adaptation layer decreasing from the absorption region towards the confinement medium.

7. The detector structure according to claim 1 comprising a second confinement medium, said second confinement medium being housed in the Fabry-Perot cavity opposite the first opening, with the first confinement medium interposed between the absorption region and said second confinement medium, the second confinement medium having a refractive index $n_{d'}$ lower than the refractive index $n_d$ of the first confinement medium.

8. The detector structure according to claim 1, the at least one first confinement medium also being arranged outside the Fabry Perot cavity, said first confinement medium at the part thereof outside the Fabry-Perot cavity forming a coating for the conductive medium having negative permittivity of thickness $h_{1'}$ less than $h_1$.

9. The detector structure according to claim 1 further comprising an incident medium upstream of the support, in the direction of propagation of electromagnetic radiation, the incident medium being configured to receive and transmit electromagnetic radiation to the support, the incident medium having a refractive index $n_{ext}$ equal to or lower than the refractive index $n_d$ of the first confinement medium,
wherein the first confinement medium is entirely contained within the Fabry-Perot cavity.

10. Device for the detection of electromagnetic radiation comprising a plurality of detector structures according to claim 1, each of the detector structures being adapted to detect electromagnetic radiation in the at least one first given range of wavelengths centred around the first wavelength $\lambda_0$, said detector structures being arranged periodically with periodicity of less than $\lambda_0/n_{ext}$ where $n_{ext}$ is the refractive index of an incident medium upstream of the support in the direction of propagation of electromagnetic radiation.

11. Method for manufacturing an electromagnetic radiation detector structure adapted to detect electromagnetic radiation in at least one first given range of wavelengths centre around a first wavelength $\lambda_0$, the manufacturing method comprising:
providing an absorption region of thickness $h_a$ less than $\lambda_0/(5.n_a)$, said absorption region having a refractive index $n_a$ and being associated with at least one confinement medium of refractive index $n_d$ lower than 80% of the refractive index $n_a$ of the absorption region,
forming a Fabry-Perot cavity so as to house at least partly therein the at least one first confinement medium and the absorption region, the Fabry-Perot cavity being laterally delimited by at least one first conductive medium having negative permittivity with $n_{eff}$ being an effective refractive index of a guided mode in the absorption region at wavelength $\lambda_0$, said Fabry-Perot cavity housing the absorption region at a distance $h_1$ from the first opening of said Fabry-Perot cavity of between $\lambda_0/(50.n_d)$ and $\lambda_0/(4.n_d)$, said forming of the Fabry Perot cavity allowing the formation of a support having a receiving surface and the at least one conductive medium, the receiving surface being arranged to receive at least part of the electromagnetic radiation and having the first opening into which the Fabry Perrot cavity leads, the Fabry-Perot cavity extending at least in part along a thickness of said support and, on at least one first portion of thickness of the support including the receiving surface and in at least one direction substantially parallel to the receiving surface, having a mean Fabry-Perot cavity length We substantially equal to $\lambda_0/(2.n_{eff})$, with $n_{eff}$ being an effective refractive index of a guided mode in the absorption region at wavelength $\lambda_0$.

12. Method for manufacturing a detector structure according to claim 11, wherein at the providing of the absorption region, there is provided the support comprising a substrate, an absorption layer and a passivation layer in succession, at least one among the substrate and passivation layer being intended to form the at least one confinement medium,
the forming of a Fabry-Perot cavity comprising:
localised etching of the support to make at least one first penetration corresponding to the conductive medium having negative permittivity, the at least one penetration delimiting a cavity housing at least in part the confinement medium and the absorption region;
filling the at least one penetration with the material of conductive medium having negative permittivity to form said conductive medium having negative permittivity and hence the Fabry-Perot cavity.

13. The manufacturing method according to claim 11 further including:
providing a second support comprising a control circuit, said control circuit having at least one contact pad;
connecting the detector structure to the control circuit via indium bump hybridization of the conducting reflective medium to the first contact pad.

14. The manufacturing method according to claim 12, where prior to the localised etching are provided:
providing a second support comprising a control circuit, said control circuit having at least one contact pad;
bonding the first support onto a surface of the first support comprising the at least one contact pad,
wherein during the localised etching, the at least one penetration leads onto the contact pad, so that during the filling of the at least one penetration, the conductive material having negative permittivity is also deposited in contact with the at least one contact pad.

* * * * *